(12) United States Patent
Taniguchi et al.

(10) Patent No.: US 9,923,110 B2
(45) Date of Patent: Mar. 20, 2018

(54) SOLAR BATTERY MODULE AND METHOD OF MANUFACTURE THEREOF

(71) Applicant: DAI NIPPON PRINTING CO., LTD., Shinjuku-ku (JP)

(72) Inventors: Kouichirou Taniguchi, Shiga (JP); Shinya Fukuda, Shiga (JP); Jun Nishioka, Shiga (JP); Michiko Otsuka, Shiga (JP); Yo Miyashita, Shiga (JP)

(73) Assignee: DAI NIPPON PRINTING CO., LTD., Shinjuku-ku (JP)

( * ) Notice: Subject to any disclaimer, the term of this patent is extended or adjusted under 35 U.S.C. 154(b) by 380 days.

(21) Appl. No.: 14/399,096

(22) PCT Filed: Apr. 2, 2013

(86) PCT No.: PCT/JP2013/060129
§ 371 (c)(1),
(2) Date: Nov. 5, 2014

(87) PCT Pub. No.: WO2013/183344
PCT Pub. Date: Dec. 12, 2013

(65) Prior Publication Data
US 2015/0155408 A1    Jun. 4, 2015

(30) Foreign Application Priority Data
Jun. 7, 2012    (JP) ................................ 2012-130067

(51) Int. Cl.
*H01L 31/048*    (2014.01)
*B32B 17/10*    (2006.01)
(Continued)

(52) U.S. Cl.
CPC .... *H01L 31/0481* (2013.01); *B32B 17/10018* (2013.01); *C08L 23/0815* (2013.01);
(Continued)

(58) Field of Classification Search
CPC .... H01L 31/0481; H01L 31/18; H01L 31/028
See application file for complete search history.

(56) References Cited

U.S. PATENT DOCUMENTS

2005/0051204 A1*    3/2005    Oi .......................... H01L 31/048
                                                                                  136/251
2008/0023063 A1    1/2008    Hayes et al.
(Continued)

FOREIGN PATENT DOCUMENTS

| CN | 102473780 A | 5/2012 |
|---|---|---|
| EP | 1 973 171 A2 | 9/2008 |

(Continued)

OTHER PUBLICATIONS

Extended European Search Report dated Jan. 13, 2016 in Patent Application No. 13800476.7.
(Continued)

*Primary Examiner* — Golam Mowla
(74) *Attorney, Agent, or Firm* — Oblon, McClelland, Maier & Neustadt, L.L.P.

(57) ABSTRACT

A solar cell module having a good appearance after lamination and a method for producing such a solar cell module are provided by specifying the combination guideline for encapsulants capable of bettering the appearance after lamination. The solar cell module contains an upper protective material (A), an encapsulant (B) for use on the side of the upper protective material (A), a solar cell device (C), an encapsulant (D) for use on the side of a back sheet (E), and the back sheet (E), wherein the encapsulant (B) and the encapsulant (D) satisfy the following requirement (P), and the production method produces the solar cell module. Requirement (P): The flow beginning temperature (TB) (° C.) of the encapsulant (B) and the flow beginning temperature (TD) (° C.) of the encapsulant (D), as measured under
(Continued)

a load of 1 kgf/cm², have the following relationship: TB−TD>0 (° C.).

17 Claims, 1 Drawing Sheet

(51) Int. Cl.
    *H01L 31/028* (2006.01)
    *H01L 31/18* (2006.01)
    *C09D 123/08* (2006.01)
    *C08L 23/08* (2006.01)

(52) U.S. Cl.
    CPC ...... *C09D 123/0815* (2013.01); *H01L 31/028* (2013.01); *H01L 31/18* (2013.01); *Y02B 10/12* (2013.01); *Y02E 10/50* (2013.01)

(56) References Cited

U.S. PATENT DOCUMENTS

| | | |
|---|---|---|
| 2008/0230114 A1 | 9/2008 | Nakatani et al. |
| 2011/0303264 A1 | 12/2011 | Taniguchi et al. |
| 2012/0216859 A1 | 8/2012 | Okamoto et al. |
| 2013/0213476 A1 | 8/2013 | Otsuka et al. |
| 2013/0247987 A1 | 9/2013 | Taniguchi et al. |

FOREIGN PATENT DOCUMENTS

| | | | |
|---|---|---|---|
| JP | 9-153635 | 6/1997 | |
| JP | 2006-324556 | 11/2006 | |
| JP | 2007-150084 | 6/2007 | |
| JP | 2008-235603 | 10/2008 | |
| JP | 2009-545185 | 12/2009 | |
| JP | 2010-177282 | 8/2010 | |
| WO | 2005/090425 A1 | 9/2005 | |
| WO | 2005/090426 A1 | 9/2005 | |
| WO | 2005/090427 A2 | 9/2005 | |
| WO | WO 2011/007871 A1 * | 1/2011 | ......... H01L 31/0203 |
| WO | 2012/014965 A1 | 2/2012 | |
| WO | WO 2012/029464 A1 | 3/2012 | |
| WO | WO 2012/073971 A1 | 6/2012 | |
| WO | 2012/105331 A1 | 8/2012 | |

OTHER PUBLICATIONS

International Search Report dated May 7, 2013, in PCT/JP2013/060129, filed Apr. 2, 2013.

Combined Office Action and Search Report dated Mar. 1, 2016 in Chinese Patent Application No. 201380026699.2 (with English translation of Categories of Cited Documents).

* cited by examiner

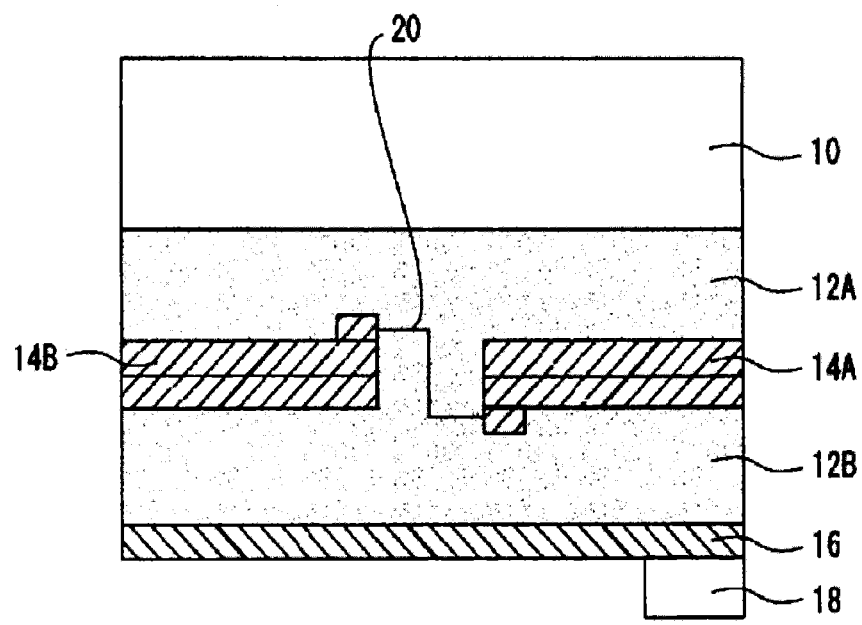

SOLAR BATTERY MODULE AND METHOD OF MANUFACTURE THEREOF

TECHNICAL FIELD

The present invention relates to a solar cell module, and precisely to a solar cell module having good appearance and to its production method.

BACKGROUND ART

Recently, with the increase in public awareness of environmental issues such as global warming and others, expectations for solar power generation have been much raised in view of the cleanness thereof and freeness from environmental pollution. A solar cell constitutes the main part of a solar power generation system which directly converts the energy of sunlight into electricity. Regarding the configuration of the solar cell, multiple solar cell devices (simply referred to as cells) are connected in series or in parallel and are packaged variously for protecting the cells to give individual units. The unit installed in the package is referred to as a solar cell module, and, in general, this is so designed that the face thereof to be exposed to sunlight is covered with a transparent substrate as an upper protective material (glass or resin sheet—hereinafter this may be expressed as a front sheet), the space is filled up with an encapsulant (encapsulant resin layer) of a thermoplastic resin (for example, ethylene-vinyl acetate copolymer or polyethylene polymer), and the back face is protected with a back encapsulant sheet as a lower protective material (hereinafter this may be expressed as a back sheet).

Here the main component of the encapsulant includes ethylene-vinyl acetate copolymer (hereinafter this may be expressed as EVA), polyethylene (hereinafter this may be expressed as PE), ionomer (hereinafter this may be expressed as IO), polyvinyl butyral (hereinafter this may be expressed as PVB), etc.

Further, the encapsulant is essentially required to satisfy softness and impact resistance for protecting solar cell devices, to satisfy heat resistance for protecting solar cell modules in heat generation, transparency (total light transmission, etc.) for efficient arrival of sunlight to solar cell devices, as well as durability, dimensional stability, flame retardance, water vapor barrier property, etc. Moreover, the encapsulant is used generally in lamination, and therefore the aptitude thereof for lamination process and the appearance thereof after lamination are also important.

Here the lamination condition for solar cell modules may be set in many cases according to a trial-and-error method in consideration of various members to be used (encapsulant, back sheet, glass, wiring, cell, flux, etc.), and therefore there are some problems in that the condition setting takes much time and the cost of the members to be used is high.

One concrete problem with the appearance in condition setting is a phenomenon that protruding projections form on the face of the back sheet (hereinafter this may be expressed as projection phenomenon). Regarding this problem, PTL 1 says that, in vacuum lamination in producing solar cell modules by the use of a back sheet (back protective sheet for solar cell module), the back sheet may shrink and the solar cell device and the lead wire (tag) that connects the devices may follow the back sheet shrinkage, whereby the lead wire may deform and the distance between the solar cell devices may vary to cause the problem. As a measure against the problem, the reference discloses that the thermal shrinkage rate of the back sheet at 150° C. for 30 minutes is preferably at most 1.0%, more preferably at most 0.5%, even more preferably within a range of from 0.3% to 0.1% (see PTL 1, paragraph 0130).

On the other hand, PTL 2 discloses that a biaxially-oriented PET film has a large thermal shrinkage rate and therefore has some risks of wire (corresponding to lead wire in PTL 1) bending or cell misalignment especially in a process of producing large-size solar cell modules, and that for solving the problem of film shrinkage to be caused by the thermal shrinkage rate, a thermal fixation step for annealing the oriented film is needed in point of facilities, which, however, brings about film cost increase, or that is, there occurs another problem in point of cost in that inexpensive back sheets could not be obtained (see PTL 2, paragraph 0007). As the measure, the reference proposes a back sheet that contains a laminate of a polycarbonate film and a gas-barrier transparent deposition film (see PTL 2, Claim 1).

CITATION LIST

Patent Literature

[PTL 1] JP-A 2007-150084
[PTL 2] JP-A 2006-324556

SUMMARY OF INVENTION

Technical Problem

As disclosed in PTL 1 and PTL 2, the existing technology to overcome the projection phenomenon is only to turn their attention to the thermal shrinkage property of the back sheet of the members to be used in producing solar cell modules. However, even though the back sheet that satisfies specific physical properties (for example, the thermal shrinkage property) is used, the projection phenomenon could not always be overcome, and the load in the trial-and-error method in setting the lamination condition could not be so much reduced. From these, some other measures and improvement guidelines are desired.

Given the situation, the present invention is to provide a solar cell module having a good appearance after lamination and a method for producing such a solar cell module, by specifying the combination guideline for encapsulants capable of bettering the appearance after lamination.

Solution to Problem

As a result of assiduous studies made repeatedly, the present inventors have found that, when the encapsulant (B) for use on the side of the upper protective material and the encapsulant (D) for use on the side of the back sheet are so combined that the flow beginning temperature thereof could satisfy a specific quantitative relationship, then a solar cell module having a good appearance after lamination can be obtained, and have completed the present invention.

Specifically, the present invention relates to a solar cell module mentioned its production method mentioned below.
<1> A solar cell module containing an upper protective material (A), an encapsulant (B) for use on the side of the upper protective material (A), a solar cell device (C), an encapsulant (D) for use on the side of a back sheet (E), and the back sheet (E), wherein the encapsulant (B) and the encapsulant (D) satisfy the following requirement (P):
Requirement (P): The flow beginning temperature (TB) (° C.) of the encapsulant (B) and the flow beginning temperature (TD) (° C.) of the encapsulant (D), as measured under a load of 1 kgf/cm², have the following relationship:

$TB-TD>0$ (° C.)

<2> The solar cell module according to the above <1>, wherein the requirement (P) is the following requirement (P-1):
Requirement (P-1): The flow beginning temperature (TB) (° C.) of the encapsulant (B) and the flow beginning temperature (TD) (° C.) of the encapsulant (D), as measured under a load of 1 kgf/cm², have the following relationship:

$50$ (° C.)$\geq TB-TD \geq 15$ (° C.)

<3> The solar cell module according to the above <1>, wherein the requirement (P) is the following requirement (P-2):
Requirement (P-2): The flow beginning temperature (TB) (° C.) of the encapsulant (B) and the flow beginning temperature (TD) (° C.) of the encapsulant (D), as measured under a load of 1 kgf/cm², have the following relationship:

$40$ (° C.)$\geq TB-TD \geq 20$ (° C.)

<4> The solar cell module according to any of the above <1> to <3>, wherein the flow beginning temperature (TD) of the encapsulant (D), as measured under a load of 1 kgf/cm², is 100° C. or higher.
<5> The solar cell module according to the above <4>, wherein the flow beginning temperature (TD) of the encapsulant (D), as measured under a load of 1 kgf/cm², is 110° C. or higher.
<6> The solar cell module according to any of the above <1> to <5>, wherein the encapsulant (B) and the encapsulant (D) are both encapsulants containing as the main component thereof an olefin-based polymer.
<7> The solar cell module according to any of the above <1> to <6>, wherein the encapsulant (B) and the encapsulant (D) are both encapsulants containing as the main component thereof a copolymer of ethylene and an α-olefin having from 3 to 20 carbon atoms.
<8> The solar cell module according to the above <7>, wherein a content of a monomer unit based on the α-olefin having from 3 to 20 carbon atoms is from 2 to 40% by mol relative to the total monomer unit in the copolymer of ethylene and the α-olefin having from 3 to 20 carbon atoms.
<9> The solar cell module according to any of the above <6> to <8>, wherein the encapsulant (B) is an encapsulant containing a resin composition that contains an olefin-based polymer having a crystal melting peak temperature of lower than 100° C. and an olefin-based polymer having a crystal melting peak temperature of 100° C. or higher.
<10> The solar cell module according to the above <9>, wherein the olefin-based polymer having a crystal melting peak temperature of 100° C. or higher is an ethylene-α-olefin block copolymer.
<11> The solar cell module according to any of the above <1> to <10>, wherein the encapsulant (B) and the encapsulant (D) are both encapsulants having a xylene soluble content of 70% by mass or more, as measured according to ASTM 2765-95.
<12> The solar cell module according to any of the above <1> to <11>, wherein at least one of the encapsulant (B) and the encapsulant (D) contains at least one additive selected from a silane coupling agent, an antioxidant, a UV absorbent and a weather-resistant stabilizer.
<13> The solar cell module according to any of the above <1> to <12>, wherein the encapsulant (B) has a laminate configuration that contains at least a soft layer of which the storage elastic modulus (E') in dynamic viscoelastometry at an oscillation frequency of 10 Hz and at a temperature of 20° C. is less than 100 MPa, and a hard layer of which the storage elastic modulus (E') in dynamic viscoelastometry at an oscillation frequency of 10 Hz and at a temperature of 20° C. is 100 MPa or more.
<14> The solar cell module according to any of the above <1> to <13>, wherein the encapsulant (D) further contains a white pigment.
<15> The solar cell module according to any of the above <1> to <14>, wherein the upper protective material (A) is a glass plate and the solar cell device (C) is at least one selected from a monocrystalline silicon form and a polycrystalline silicone form.
<16> A method for producing a solar cell module containing laminating a solar cell modules that includes an upper protective material (A), an encapsulant (B) for use on the side of the upper protective material (A), a solar cell device (C), an encapsulant (D) for use on the side of a back sheet (E) and the back sheet (E), wherein the flow beginning temperature (TB) (° C.) of the encapsulant (B) and the flow beginning temperature (TD) (° C.) of the encapsulant (D), as measured under a load of 1 kgf/cm², differ from each other, and the encapsulant having a higher flow beginning temperature is arranged on the side of the heat source in lamination.
<17> The method for producing a solar cell module according to the above <16>, wherein the preset lamination temperature in lamination is from 100 to 135° C.

Advantageous Effects of Invention

According to the present invention, there are provided a solar cell module having a good appearance after lamination and a method for producing such a solar cell module, by combining encapsulants of which the flow beginning temperatures are in a specific relationship.

In addition, by measuring the basic physical property, flow beginning temperature of the encapsulant, it is possible to predict the final appearance before actual lamination of solar cell modules. Further, since the lamination condition can be set efficiently, the time to be taken for condition investigation and the cost of various members can be reduced and, as a result, the production cost of solar cell module can be greatly reduced.

BRIEF DESCRIPTION OF DRAWING

FIG. 1 This is a schematic cross-sectional view showing one example of the solar cell module of the present invention.

DESCRIPTION OF EMBODIMENTS

Embodiments of the solar cell module of the present invention are described below. However, the scope of the present invention is not limited to the embodiments described below.

In the present specification, the "main component" is stated to the effect that the composition may contain any other component within a range not detracting from the effect and the advantage of the resin that constitutes the individual members of the solar cell module of the present invention. Further, though the term thereof is not to restrict any concrete content, the main component is an component that accounts for generally 50% by mass or more of all the constituent components of the resin composition, preferably 65% by mass or more, more preferably 80% by mass or more and is 100% by mass or less.

The present invention is described in detail hereinunder.

The solar cell module of the present invention comprises an upper protective material (A), an encapsulant (B) for use on the side of the upper protective material (A), a solar cell device (C), an encapsulant (D) for use on the side of a back sheet (E) and the back sheet (E), wherein the flow beginning temperature of the encapsulant (B) and that of the encapsulant (D) satisfy a specific relationship.

[Upper Protective Material (A)]

The upper protective material (A) for use in the present invention is not specifically defined. For example, there are mentioned plates and single-layer or multi-layer films of glass, acrylic resin, polycarbonate resin, polyester resin, fluororesin, etc. As a glass plate, there are mentioned white sheet glass, reinforced glass, double-reinforced glass, heat ray-reflective glass, reinforces white sheet glass, etc. Generally used here is white sheet glass having a thickness of from 3 to 5 mm or so. In the present invention, favorably used are tabular materials having a thickness of 5 mm or so of the glass plate from the viewpoint of the economic aspect and the mechanical strength thereof, and acrylic resin or polycarbonate resin from the viewpoint of the lightweightness and the workability thereof.

[Encapsulant (B)]

Not specifically defined, the encapsulant (B) for use in the present invention may be any one satisfying the requirement (P) described below. Concretely, there are mentioned encapsulants containing, as the main component thereof, ethylene-vinyl acetate copolymer (EVA), polyethylene (PE), polypropylene (PP), ionomer (IO), polyvinyl butyral (PVB) or the like. Especially preferred for use in the present invention are encapsulants containing, as the main component thereof, an olefin-based polymer, especially at least one olefin-based polymer of the following (b1) to (b4). Here as the main component, preferred are those of (b1) or (b2), from the viewpoint of the softness of the encapsulants to be obtained, the absence of fish eyes (gels), the absence of circuit-corrosive substances (acetic acid, etc.), the economic aspect and others; and more preferred are those of (b1) from the viewpoint that they are excellent in low-temperature characteristics.

(b1)

(b1) is a copolymer of ethylene and an α-olefin having from 3 to 20 carbon atoms. The copolymer is not specifically defined in point of the copolymerization type (random, block, etc.), the branching, the branching degree distribution and the configuration thereof, and may include any polymer of isotactic, atactic or syndiotactic ones or mixtures thereof. Here, example of the α-olefin to copolymerize with ethylene include propylene, 1-butene, 1-pentene, 1-hexene, 1-heptene, 1-octene, 1-nonene, 1-decene, 3-methyl-butene-1,4-methyl-pentene-1, etc.

In the present invention, from the viewpoint of the industrial availability and various properties thereof and also from the economic aspect thereof, propylene, 1-butene, 1-hexene and 1-octene are preferred as the α-olefin to copolymerize with ethylene. Further from the viewpoint of the transparency and the softness thereof, an ethylene-α-olefin random copolymer is preferred for use herein. One alone or two or more different types of the α-olefins capable of copolymerizing with ethylene may be used.

The content of the α-olefin to copolymerize with ethylene is not specifically defined. Relative to all the monomer units in the copolymer (b1) of ethylene and an α-olefin having from 3 to 20 carbon atoms, the monomer unit based on the α-olefin having from 3 to 20 carbon atoms is generally 2% by mol or more, but preferably from 2 to 40% by mol, more preferably from 3 to 30% by mol, even more preferably from 5 to 25% by mol. Falling within the range, the copolymerization component can reduce the crystallinity and the transparency of the copolymer can be thereby increased; and another advantage is that the raw material pellets hardly undergo failures such as blocking, etc. The type and the content of the monomer to copolymerize with ethylene may be determined through qualitative and quantitative analysis according to a known method, for example, using a nuclear magnetic resonance (NMR) apparatus or any other analyzer.

The copolymer (b1) of ethylene and an α-olefin having from 3 to 20 carbon atoms may contain any other monomer unit based on other monomers than α-olefins. The additional monomer includes, for example, cyclic olefins, vinyl-aromatic compounds (styrene, etc.), polyene compounds, etc. The content of the additional monomer unit is preferably 20% by mol or less based on all the monomer units, 100% by mol in the copolymer (b1) of ethylene and an α-olefin having from 3 to 20 carbon atoms, more preferably 15% by mol or less.

The configuration, the branching, the branching degree distribution and the molecular weight distribution of the copolymer (b1) of ethylene and an α-olefin having from 3 to 20 carbon atoms are not specifically defined. For example, a copolymer having long-chain branches could generally have good mechanical properties and have advantages in that its melt tension in molding into sheets is high and the calendering moldability thereof is improved.

Not specifically defined, the melt flow rate (MFR) of the copolymer (b1) of ethylene and an α-olefin having from 3 to 20 carbon atoms for use in the present invention is generally from 0.5 to 100 g/10 min or so as MFR thereof (JIS K7210, temperature: 190° C., load: 21.18 N), preferably from 1 to 50 g/10 min, more preferably from 2 to 50 g/10 min, even more preferably from 3 to 30 g/10 min.

In this, MFR may be selected in consideration of the moldability and the workability in molding into sheets, the adhesiveness and the spreadability in sealing solar cell devices (simply referred to as cells), etc. For example, when sheets are produced through calender-molding, MFR of the copolymer to be used is preferably a relatively low value, concretely from 0.5 to 5 g/10 min or so in view of the handleability in peeling the sheet from molding rolls; but when sheets are produced through extrusion using a T-die, MFR of the copolymer is preferably from 1 to 50 g/10 min, more preferably from 2 to 50 g/10 min, even more preferably from 3 to 30 g/10 min from the viewpoint of reducing the extrusion load and increasing the extrusion output. Further, from the viewpoint of the adhesiveness and the spreadability in sealing solar cell devices (simply referred to as cells), MFR of the copolymer to be used is preferably from 2 to 50 g/10 min, more preferably from 3 to 30 g/10 min.

The production method for the copolymer (b1) of ethylene and an α-olefin having from 3 to 20 carbon atoms is not specifically defined, for which is employable any known polymerization method using a known olefin polymerization catalyst. For example, there are mentioned a slurry polymerization method, a solution polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, from the viewpoint of attaining easy granulation (pelletization) after polymerization and also from the viewpoint of preventing the raw material pellets from blocking together, preferred is a polymerization method using a single-site catalyst, in which a raw material can be polymerized to give a polymer having few low-molecular-weight components and having a narrow molecular weight distribution.

The heat of crystal fusion of the copolymer (b1) of ethylene and an α-olefin having from 3 to 20 carbon atoms for use in the present invention, as measured at a heating rate of 10° C./min in differential scanning calorimetry, is preferably from 0 to 70 J/g. Falling within the range, the copolymer is preferred as capable of securing the softness and the transparency (total light transmission) of the encapsulant to be obtained. Taking the matter into consideration that the raw material pellets would readily block together in a high temperature condition in summer or the like, the heat of crystal fusion is preferably from 5 to 70 J/g, more preferably from 10 to 65 J/g.

The heat of crystal fusion may be measured at a heating rate of 10° C./min, using a differential scanning calorimeter and according to JIS K7122.

Specific examples of the copolymer (b1) of ethylene and an α-olefin having from 3 to 20 carbon atoms for use in the present invention include Dow Chemical's trade names "ENGAGE", "AFFINITY" and "INFUSE", Exxon Mobile's trade name "EXACT", Mitsui Chemical's trade names "TAFMER H", "TAFMER A" and TAFMER P", LG Chemical's trade name "LUCENE", Japan Polyethylene's trade name "KARNEL", etc.

(b2)

(b2) is a copolymer of propylene and any other monomer copolymerizable with propylene, or a homopolymer of propylene. The copolymer is not specifically defined in point of the copolymerization type (random, block, etc.), the branching, the branching degree distribution and the configuration thereof, and may include any polymer of isotactic, atactic or syndiotactic ones or mixtures thereof.

Examples of the monomer capable of copolymerizable with propylene include ethylene; α-olefins having from 4 to 12 carbon atoms such as 1-butene, 1-hexene, 4-methylpentene-1,1-octene, etc.; dienes such as divinylbenzene, 1,4-cyclohexadiene, dicyclopentadiene, cyclooctadiene, ethylidenenorbornene, etc.

In the present invention, from the viewpoint of the industrial availability and various properties thereof and also from the economic aspect thereof, ethylene and 1-butene are preferably used as the α-olefin to copolymerize with propylene. Further from the viewpoint of the transparency and the softness thereof, a propylene-α-olefin random copolymer is preferred for use herein. One alone or two or more different types of α-olefins capable of copolymerizing with propylene may be used.

The content of the other monomer capable of copolymerizable with propylene is not specifically defined. Relative to all the monomer units in the copolymer (b2) of propylene and any other monomer copolymerizable with propylene, the monomer unit based on the other monomer capable of copolymerizable with propylene is generally 2% by mol or more but preferably from 2 to 40% by mol, more preferably from 3 to 30% by mol, even more preferably from 5 to 25% by mol. Falling within the range, the copolymerization component can reduce the crystallinity and the transparency of the copolymer can be thereby increased; and another advantage is that the raw material pellets hardly undergo failures such as blocking, etc. The type and the content of the other monomer to copolymerize with propylene may be determined through qualitative and quantitative analysis according to a known method, for example, using a nuclear magnetic resonance (NMR) apparatus or any other analyzer.

Not specifically defined, the melt flow rate (MFR) of (b2) for use in the present invention is generally from 0.5 to 100 g/10 min or so as MFR thereof (JIS K7210, temperature: 230° C., load: 21.18 N), preferably from 2 to 50 g/10 min, more preferably from 3 to 30 g/10 min.

In this, MFR may be selected in consideration of the moldability and the workability in molding into sheets, the adhesiveness and the spreadability in sealing solar cell devices (simply referred to as cells), etc. For example, when sheets are produced through calender-molding, MFR of the polymer to be used is preferably a relatively low value, concretely from 0.5 to 5 g/10 min or so in view of the handleability in peeling the sheet from molding rolls; but when sheets are produced through extrusion using a T-die, MFR of the polymer is preferably from 2 to 50 g/10 min, more preferably from 3 to 30 g/10 min from the viewpoint of reducing the extrusion load and increasing the extrusion output. Further, from the viewpoint of the adhesiveness and the spreadability in sealing solar cell devices (simply referred to as cells), MFR of the polymer to be used is preferably from 2 to 50 g/10 min, more preferably from 3 to 30 g/10 min.

The production method for (b2) for use in the present invention, a copolymer of propylene and any other monomer copolymerizable with propylene or a homopolymer of propylene, is not specifically defined, for which is employable any known polymerization method using a known olefin polymerization catalyst. For example, there are mentioned a slurry polymerization method, a solution polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, from the viewpoint of attaining easy granulation (pelletization) after polymerization and also from the viewpoint of preventing the raw material pellets from blocking together, preferred is a polymerization method using a single-site catalyst, in which a raw material can be polymerized to give a polymer having few low-molecular-weight components and having a narrow molecular weight distribution.

Specific examples of (b2) for use in the present invention include a propylene-butene random copolymer, a propylene-ethylene random copolymer and a propylene-ethylene-butene-1 copolymer, etc.; and concrete commercial products thereof include Mitsui Chemical's trade names "TAFMER XM" and "NOTIO", Sumitomo Chemical's trade name "TAFFCELLEN", Prime Polymer's trade name "PRIME TPO", Dow Chemical's trade name "VERSIFY", Exxon Mobile's trade name "VISTAMAXX", etc.

(b3)

(b3) is a metal salt of a copolymer of an α-olefin such as ethylene, propylene or the like and an aliphatic unsaturated carboxylic acid (in which the metal is preferably Zn, Na, K, Li, Mg or the like).

Concrete commercial products of the salt include Mitsui Chemical's trade name "HIMILAN", Dow Chemical's trade name "AMPLIFY IO", etc.

(b4)

(b4) is an ethylene-based copolymer of ethylene and at least one monomer selected from a vinyl acetate, an aliphatic unsaturated carboxylic acid and an alkyl ester of an aliphatic unsaturated monocarboxylic acid.

Concretely, there are mentioned ethylene-acrylic acid copolymers, ethylene-methacrylic acid copolymers, ethylene acrylate copolymers, ethylene methacrylate copolymers, etc. Here as the ester component, there are mentioned esters with an alcohol having from 1 to 8 carbon atoms, such as methyl, ethyl, propyl, butyl and the like esters. In the present invention, the copolymer is not limited to the above-mentioned binary copolymer, but may include a ternary or more polynary copolymers with any additional third component added thereto (for example, ternary or more polynary copolymers of ethylene and any others suitably selected from aliphatic unsaturated carboxylic acids and aliphatic unsaturated carboxylates) Here the content of the comonomer to copolymerize with ethylene is generally from 5 to 35% by mass relative to all the monomer units in the copolymer.

The encapsulant (B) for use in the present invention has a single-layer or laminate configuration, but preferably has a laminate configuration for attaining the properties necessary for encapsulant in a well-balanced manner. Here the properties that are generally required for encapsulant are softness and impact resistance for protecting solar cell devices, heat resistance for protecting solar cell modules in heat generation, transparency (total light transmission, etc.) for efficient arrival of sunlight to solar cell devices, adhesiveness to various adherends (glass, back sheet, etc.), as well as durability, dimensional stability, flame retardance, water vapor barrier property, economic efficiency, etc. Above all, softness, balance of heat resistance and transparency, and economic efficiency are considered to be specifically important.

(Crystal Melting Peak Temperature of Olefin-Based Polymer)

Preferably, the encapsulant (B) for use in the present invention contains a resin composition that contains, as the main component thereof, any of the above-mentioned olefin-based polymers (b1) to (b4).

It is desirable that the crystal melting peak temperature (Tm) of the main component, olefin-based polymer is lower than 100° C., however in the present invention, a polymer not expressing a crystal melting peak temperature, or that is an amorphous polymer is employable (hereinafter including an amorphous polymer, the polymer of the type is referred to as an olefin-based polymer having a crystal melting peak temperature of lower than 100° C.). In consideration of the trouble of blocking of raw material pellets, it is desirable that the crystal melting peak temperature is from 30 to 95° C., more desirably from 45 to 80° C., even more desirably from 60 to 80° C.

Emphasizing the softness of the encapsulant, it is desirable that the olefin-based polymer having a crystal melting peak temperature (Tm) of lower than 100° C. is mixed with an olefin-based polymer having a crystal melting peak temperature (Tm) of 100° C. or higher for use herein. The upper limit of the crystal melting peak temperature (Tm) of the additional olefin-based polymer to be mixed here is not specifically defined; however, in consideration of the risk of thermal degradation of solar cell devices (cells) or the preset lamination temperature in production of solar cell modules, the upper limit is 150° C. or so. In the present invention, the preset lamination temperature in the process of producing solar cell modules can be lowered and therefore the solar cell devices (cells) to be used therein hardly undergo thermal degradation, and consequently, the upper limit of the crystal melting peak temperature (Tm) of the additional olefin-based polymer to be mixed is preferably 130° C., more preferably 125° C.

Some reference data of the crystal melting peak temperature are shown here. Ordinary high-density polyethylene resin (HDPE) has from 130 to 145° C. or so; low-density polyethylene resin (LDPE) and linear low-density polyethylene (LLDPE) have from 100 to 125° C. or so; ordinary homopolypropylene resin has 165° C. or so; ordinary propylene-ethylene random copolymer has from 130 to 150° C. or so. The crystal melting peak temperature can be measured at a heating rate of 10° C./min, using a differential scanning calorimeter and according to JIS K7121.

Preferably, the encapsulant (B) for use in the present invention is formed by a resin composition that contains an olefin-based polymer having a crystal melting peak temperature of lower than 100° C. and an olefin-based polymer having a crystal melting peak temperature of 100° C. or higher, as described above.

The contents of the two olefin-based polymers in the resin composition are not specifically defined; however, in consideration of the softness, the heat resistance and the transparency of the encapsulant to be obtained, the blend (content) ratio by mass of the two olefin-based polymers (olefin-based polymer having a crystal melting peak temperature of lower than 100° C./olefin-based polymer having a crystal melting peak temperature of 100° C. or higher) is preferably (99 to 50)/(1 to 50), more preferably (98 to 60)/(2 to 40), even more preferably (97 to 70)/(3 to 30), still more preferably (97 to 80)/(3 to 20), most preferably (97 to 90)/(3 to 10). In this, the total of the two olefin-based polymers is 100 parts by mass. The blend (content) ratio by mass falling within the above range is preferred as facilitating the provision of encapsulants excellent in balance of softness, heat resistance, transparency, etc.

The olefin-based polymer having a crystal melting peak temperature of 100° C. or higher that may be mixed in the encapsulant (B) for use in the present invention may be suitably selected in consideration of the desired properties thereof, and in the present invention, most suitably used is an ethylene-α-olefin block copolymer as excellent in balance of heat resistance, softness, low-temperature characteristics, etc.

(Ethylene-α-Olefin Block Copolymer)

The block structure of the ethylene-α-olefin block copolymer is not specifically defined but is preferably a multi-block structure containing two or more segments or blocks differing from each other in point of the comonomer content, the crystallinity, the density, the crystal melting peak temperature (Tm) or the glass transition temperature (Tg) thereof, from the viewpoint of attaining well-balanced softness, heat resistance, transparency and others. Concretely, there are mentioned a completely symmetric block structure, an asymmetric block structure, a tapered block structure (in which the proportion of the block structures gradually increases in the main chain), etc. Regarding the configuration of the copolymer having the multi-block structure and the production method for the copolymer, those disclosed in detail in WO2005/090425, WO2005/090426, WO2005/090427 and others may be hereby incorporated by reference.

The ethylene-α-olefin block copolymer having a multi-block structure is described in detail hereinunder.

The ethylene-α-olefin block copolymer having a multi-block structure is favorably used in the present invention, and preferred is an ethylene-octene multi-block copolymer in which 1-octene is the comonomer, α-olefin. The block copolymer is preferably a multi-block copolymer that contains two or more, nearly amorphous soft segments in which the proportion of the copolymerized octene component is large (about 15 to 20% by mol) relative to ethylene, and two or more, high-crystalline hard segments in which the proportion of the copolymerized octene component is small (less than about 2% by mol) relative to ethylene and which have a crystal melting peak temperature of from 110 to 145° C. By suitably controlling the chain length and the proportion of these soft segments and hard segments therein, the block copolymer can be made to satisfy both softness and heat resistance.

Specific examples of the multi-block structure-having copolymer include Dow Chemical's trade name "INFUSE".

For the surface of the encapsulant (B) for use in the present invention, handleability and air bleedability as well as adhesiveness to various adherends (glass, back sheet, solar cell, etc.) are required as important functions. Therefore, as the encapsulant (B) in the present invention, preferred is a resin composition prepared by adding silane coupling agent to be mentioned below or a silane-modified ethylene-based resin also to be mentioned below, to any of the above-mentioned (b1) to (b4).

(Silane-Modified Ethylene-Based Resin)

The silane-modified ethylene-based resin for use in the present invention is generally obtained by melting and mixing a polyethylene-based resin, a vinylsilane compound and a radical generator at a high temperature (160° C. to 220° C. or so), and graft-polymerizing them.

(Polyethylene-Based Resin)

The polyethylene-based resin is not specifically defined. Concretely, there are mentioned low-density polyethylene, middle-density polyethylene, high-density polyethylene, ultra-low-density polyethylene, and linear low-density polyethylene. One alone or two or more different types of these may be used. Especially preferred is polyethylene mentioned as (b1) hereinabove.

In the present invention, preferably used is a polyethylene-based resin having a low density as bettering transparency and flexibility. Concretely, preferred is a polyethylene-based resin having a density of from 0.850 to 0.920 g/cm$^3$, and more preferred is a linear low-density polyethylene having a density of from 0.860 to 0.880 g/cm$^3$. If desired, a polyethylene-based resin having a low density and a polyethylene-based resin having a high density can be combined for use herein. Combined use of the resins is preferred as facilitating relatively easy control of the balance of transparency, flexibility and heat resistance.

(Vinylsilane Compound)

Not specifically defined, the vinylsilane compound may be any one capable of graft-copolymerizing with the above-mentioned polyethylene-based resin. For example, there are mentioned vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyloxysilane, vinyltriacetoxysilane, and vinyltricarboxysilane. One alone or two or more different types of these vinylsilane compounds may be used. In the present invention, preferred is use of vinyltrimethoxysilane from the viewpoint of the reactivity, the adhesiveness and the color.

Not specifically defined, the amount of the vinylsilane compound to be added is generally from 0.01 to 10.0 parts by mass relative to 100 parts by mass of the polyethylene-based resin to be used, more preferably from 0.3 to 8.0 parts by mass, even more preferably from 1.0 to 5.0 parts by mass.

(Radical Generator)

Not specifically defined, the radical generator includes organic peroxides, for example, hydroperoxides such as diisopropylbenzene hydroperoxide, 2,5-dimethyl-2,5-di(hydroperoxy)hexane, etc.; dialkyl peroxides such as di-t-butyl peroxide, t-butylcumyl peroxide, dicumyl peroxide, 2,5-dimethyl-2,5-di(t-butylperoxy)hexane, 2,5-dimethyl-2,5-di(t-peroxy)hexyne-3, etc.; diacyl peroxides such as bis-3,5,5-trimethylhexanoyl peroxide, octanoyl peroxide, benzoyl peroxide, o-methylbenzoyl peroxide, 2,4-dichlorobenzoyl peroxide, etc.; peroxyesters such as t-butylperoxy acetate, t-butylperoxy-2-ethyl hexanoate, t-butylperoxy pivalate, t-butylperoxy octanoate, t-butylperoxyisopropyl carbonate, t-butylperoxy benzoate, di-t-butylperoxy phthalate, 2,5-dimethyl-2,5-di(benzoylperoxy)hexane, 2,5-dimethyl-2,5-di(benzoylperoxy)hexyne-3, etc.; ketone peroxides such as methyl ethyl ketone peroxide, cyclohexanone peroxide, etc.; azo compounds such as azobisisobutyronitrile, azobis(2,4-dimethylvaleronitrile), etc. One alone or two or more different types of these radical initiators may be used.

Not specifically defined, the amount of the radical generator to be added is generally from 0.01 to 5.0 parts by mass relative to 100 parts by mass of the polyethylene-based resin to be used, more preferably from 0.02 to 1.0 part by mass, even more preferably from 0.03 to 0.5 parts by mass. The amount of the remaining radical generator is preferably 0.001% by mass or less in the resin composition to constitute the encapsulant (B) for use in the present invention. The radical generator, if remaining in the resin composition may gel by heating. Gelation may be caused not only by the presence of the radical generator in the encapsulant but also by contamination with some gelled fraction in production of the encapsulant. Gelation interferes with the flowability of the encapsulant and therefore detracts from the reliability of solar cell modules; and therefore it is desirable to minimize gelation. Accordingly, the gel fraction in the resin composition to constitute the encapsulant (B) for use in the present invention is preferably at most 30%, more preferably at most 10%, even more preferably at most 5%, still more preferably 0%.

Preferably, the silane-modified ethylene-based resin and the resin composition containing, as the main component thereof, the olefin-based polymer of (b1) to (b4) for use in the present invention do not substantially contain a silanol condensation catalyst of promoting condensation between silanols. Specific examples of the silanol condensation catalyst include, for example, dibutyltin diacetate, dibutyltin dilaurate, dibutyltin dioctanoate, dioctyltin dilaurate, etc.

"Substantially not containing" as referred to herein means that the content is generally 0.05 parts by mass or less relative to 100 parts by mass of the silane-modified ethylene-based resin or the resin composition containing, as the main component thereof, the olefin-based polymer of (b1) to (b4), but preferably 0.03 parts by mass or less, more preferably 0.00 part by mass.

The reason why it is desirable that the resin does not substantially contain a silanol condensation catalyst is because, in the present invention, it is intended that the silanol crosslinking reaction is not positively promoted but the adhesiveness is expressed by the interaction such as the hydrogen bond or the covalent bond between the polar group such as the silanol group grafted on the polyethylene-based resin to be used and the adherend (glass, various plastic sheets (preferably those surface-treated through corona treatment or the like in any desired manner and having a wettability index of 50 mN/m or higher), metals, etc.).

Specific examples of the silane-modified ethylene-based resin for use in the present invention include Mitsubishi Chemical's trade name "LINKLON".

(Additives)

If desired, various types of additives may be added to the resin composition to constitute the encapsulant (B) for use in the present invention. The additives include, for example, a silane coupling agent, an antioxidant, a UV absorbent, a weather-resistant stabilizer, a light diffusing agent, a heat releasing agent, a nucleating agent, a pigment (e.g., titanium oxide, carbon black, etc.), a flame retardant, a discoloration inhibitor, etc. In the present invention, it is desirable that the encapsulant (B) contains at least one additive selected from a silane coupling agent, an antioxidant, a UV absorbent and a weather-resistant stabilizer, for the reason mentioned below.

In the present invention, it is unnecessary to add a crosslinking and a crosslinking promoter to the resin composition to constitute the encapsulant, however, the invention does not exclude the addition, and, for example, in case where high-level heat resistance is desired for the encapsulant, a crosslinking agent and/or a crosslinking promoter may be added to the composition. Preferably, in the present invention, the encapsulant (B) to be used is an encapsulant that does not substantially crosslinked.

Here, "not substantially crosslinked" means that the xylene soluble content in the composition, as measured according to ASTM 2765-95, is generally 70% by mass or more, preferably 85% by mass or more, more preferably 95% by mass or more.

(Silane Coupling Agent)

The silane coupling agent is effective for enhancing the adhesiveness of the encapsulant to a protective material (front sheet, back sheet and others made of glass or resin, etc.) and to solar cell devices and others; and as its examples, there are mentioned compounds having an unsaturated group such as a vinyl group, an acryloxy group or a methacryloxy group, as well as an amino group, an epoxy group or the like, and additionally having a hydrolysable group such as an alkoxy group.

Examples of the silane coupling agent include N-(β-aminoethyl)-γ-aminopropyltrimethoxysilane, N-(β-aminoethyl)-γ-aminopropylmethyldimethoxysilane, γ-aminopropyltriethoxysilane, γ-glycidoxypropyltrimethoxysilane, γ-methacryloxypropyltrimethoxysilane, etc. One alone or two or more different types of these silane coupling agents may be used. In the present invention, preferred is use of γ-glycidoxypropyltrimethoxysilane and γ-methacryloxypropyltrimethoxysilane as securing good adhesiveness and causing little discoloration such as yellowing.

The amount of the silane coupling agent to be added is generally from 0.1 to 5 parts by mass or so relative to 100 parts by mass of the resin composition to constitute the encapsulant (B), preferably from 0.2 to 3 parts by mass. Like the silane coupling agent, any other coupling agent of an organic titanate compound or the like may also be used effectively here.

(Antioxidant)

Various commercial products are usable here as the antioxidant. There are mentioned various types of antioxidants such as monophenol-type, bisphenol-type, polymeric phenol-type, sulfur-containing, and phosphite-type antioxidants, etc.

The monophenol-type antioxidants include, for example, 2,6-di-tert-butyl-p-cresol, butylated hydroxyanisole, 2,6-di-tert-butyl-4-ethylphenol, etc. The bisphenol-type antioxidants include 2,2'-methylenebis(4-methyl-6-tert-butylphenol), 2,2'-methylenebis(4-ethyl-6-tert-butylphenol), 4,4'-thiobis(3-methyl-6-tert-butylphenol), 4,4'-butylidenebis(3-methyl-6-tert-butylphenol), 3,9-bis[{1,1-dimethyl-2-{β-(3-tert-butyl-4-hydroxy-5-methylphenyl) propionyloxy}ethyl}2,4,9,10-tetroxaspiro]5,5-undecane, etc.

The polymeric phenol-type antioxidants include 1,1,3-tris (2-methyl-4-hydroxy-5-tert-butylphenyl)butane, 1,3,5-trimethyl-2,4,6-tris(3,5-di-tert-butyl-4-hydrpxybenzyl)benzene, tetrakis-{methylene-3-(3',5'-di-tert-butyl-4'-hydroxyphenyl) propionate}methane, bis{(3,3'-bis-4'-hydroxy-3'-tert-butylphenyl)butyric acid}glucose ester, 1,3,5-tris(3',5'-di-tert-butyl-4'-hydroxybenzyl)-s-triazine-2,4,6-(1H,3H,5H)trione, triphenol (vitamin E), etc.

The sulfur-containing antioxidants include dilauroyl thiodipropionate, dimyristyl thiodipropionate, distearyl thiopropionate, etc.

The phosphite-type antioxidants include triphenyl phosphite, diphenylisodecyl phosphite, phenyldiisodecyl phosphite, 4,4'-butylidene-bis(3-methyl-6-tert-butylphenyl-ditridecyl)phosphite, cyclic neopentanetetrayl bis(octadecyl phosphite), tris(mono and/or di)phenyl phosphite, diisodecyl pentaerythritol diphosphite, 9,10-dihydro-9-oxa-10-phosphaphenanthrene-10-oxide, 10-(3,5-di-tert-butyl-4-hydroxybenzyl)-9,10-dihydro-9-oxa-10-phosphaphenanthrene-10-oxide, 10-decyloxy-9,10-dihydro-9-oxa-10-phosphaphenanthrene, cyclic neopentanetetrayl bis(2,4-di-tert-butylphenyl)phosphite, cyclic neopentanetetrayl bis(2,6-di-tert-methylphenyl)phosphite, 2,2-methylenebis(4,6-tert-butylphenyl)octyl phosphite, etc.

One alone or two or more different types of the above antioxidants may be used.

In the present invention, preferably used are phenol-type antioxidants such as monophenol-type, bisphenol-type and polymeric phenol-type ones, as well as phosphite-type antioxidants from the viewpoint of the effect, the thermal stability and the economic potential thereof, and more preferably the two different types of those antioxidants are combined for use herein.

The amount of the antioxidant to be added is generally from 0.1 to 1 part by mass or so relative to 100 parts by mass of the resin composition to constitute the encapsulant (B), but preferably from 0.2 to 0.5 parts by mass.

<UV Absorbent>

Various commercial products are usable here as the UV absorbent, including various types of benzophenone-type, benzotriazole-type, triazine-type or salicylate-type UV absorbents and others.

The benzophenone-type UV absorbents include 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, 2,2',4,4'-tetrahydroxybenzophenone, etc.

The benzotriazole-type UV absorbents include hydroxyphenyl-substituted benzotriazole compounds, for example, 2-(2-hydroxy-5-methylphenyl)benzotriazole, 2-(2-hydroxy-5-t-butylphenyl)benzotriazole, 2-(2-hydroxy-3,5-dimethylphenyl)benzotriazole, 2-(2-methyl-4-hydroxyphenyl)benzotriazole, 2-(2-hydroxy-3-methyl-5-t-butylphenyl) benzotriazole, 2-(2-hydroxy-3,5-di-t-amylphenyl) benzotriazole, 2-(2-hydroxy-3,5-di-t-butylphenyl) benzotriazole, etc.

The triazine-type UV absorbents include 2-[4,6-bis(2,4-dimethylphenyl)-1,3,5-triazin-2-yl]-5-(octyloxy)phenol, 2-(4,6-diphenyl-1,3,5-triazin-2-yl)-5-(hexyloxy)phenol, etc.

The salicylate-type UV absorbents include phenyl salicylate, p-octylphenyl salicylate, etc.

One alone or two or more different types of the above UV absorbents may be used.

The amount of the UV absorbent to be added is generally from 0.01 to 2.0 parts by mass or so relative to 100 parts by mass of the resin composition to constitute the encapsulant (B), but preferably from 0.05 to 0.5 parts by mass.

<Weather-Resistant Stabilizer>

As the weather-resistant stabilizer for imparting weather resistance apart from the above-mentioned UV absorbent, preferred is use of hindered amine-type light stabilizers. The hindered amine-type light stabilizer does not absorb UV rays, different from UV absorbents, but when combined with a UV-absorbent, it exhibits a noticeable synergistic effect. Some others than hindered amine-type compounds may function as a light stabilizer, but many of such compounds are colored and are therefore unfavorable for the encapsulant (B) for use in the present invention.

The hindered amine-type light stabilizer includes dimethyl succinate/1-(2-hydroxyethyl)-4-hydroxy-2,2,6,6-tetramethylpiperidine polycondensate, poly[{6-(1,1,3,3-tetramethylbutyl)amino-1,3,5-triazine-2,4-diyl}{(2,2,6,6-tetramethyl-4-piperidyl)imino}hexamethylene{{2,2,6,6-tetramethyl-4-piperidyl}imino}], N,N'-bis(3-aminopropyl)ethylenediamine-2,4-bis[N-butyl-N-(1,2,2,6,6-pentamethyl-4-piperidyl)amino]-6-chloro-1,3,5-triazine condensate, bis(2,2,6,6-tetramethyl-4-piperidyl) sebacate, bis(1,2,2,6,6-pentamethyl-4-piperidyl) 2-(3,5-di-tert-4-hydroxybenzyl)-2-n-butylmalonate, etc. One alone or two or more different types of the above hindered amine-type light stabilizers may be used.

The amount of the hindered amine-type light stabilizer to be added is generally from 0.01 to 0.5 parts by mass or so relative to 100 parts by mass of the resin composition to constitute the encapsulant (B), but is preferably from 0.05 to 0.3 parts by mass.

Not specifically defined, the softness of the encapsulant (B) for use in the present invention may be suitably controlled in consideration of the shape and the thickness of the solar cell to which it is applied and of the site where the solar cell is installed.

For example, the storage elastic modulus (E') of the encapsulant (B) is preferably from 1 to 2000 MPa, as measured through dynamic viscoelasticity measurement at an oscillation frequency of 10 Hz and at a temperature of 20° C. In consideration of the ability thereof to protect solar cell devices and of the softness thereof, the storage elastic modulus (E') of the encapsulant is preferably from 1 to 100 MPa, more preferably from 5 to 50 MPa. When the encapsulant (B) has a multilayer configuration, the storage elastic modulus (E') is the storage elastic modulus of the entire multilayer configuration of the material. In consideration of the handleability of the encapsulant that is prepared in the form of a sheet or the like, and in consideration of preventing the surfaces of the sheet-like material from blocking together and further in consideration of weight reduction of solar cell modules (thin-filmy glass (1.1 mm or so) is applicable generally to 3 mm or so, or glassless configuration is applicable), storage elastic modulus is preferably from 100 to 800 MPa, more preferably from 200 to 600 MPa. The storage elastic modulus (E') may be measured using a viscoelasticity measuring device at an oscillation frequency of 10 Hz and at a temperature falling within a predetermined range, and the value thereof at a temperature of 20° C. can be determined.

The heat resistance of the encapsulant (B) for use in the present invention is influenced by various properties of the olefin-based polymer to be used (crystal melting peak temperature, heat of crystal fusion, MFR, molecular weight, etc.), and can be therefore suitably controlled by suitably selecting these. In particular, the crystal melting peak temperature and the molecular weight of the olefin-based polymer have significant influences thereon. In general, solar cell modules are heated up to 85° C. or so by the heat generated during power generation or by the radiation heat of sunlight; however, so far as the crystal melting peak temperature is 100° C. or higher, the encapsulant (B) for use in the present invention can favorably secure the heat resistance thereof.

The total light transmittance (JIS K7105) of the encapsulant (B) for use in the present invention may not be that important depending on the type of the solar cells to which the encapsulant is applied, or for example, in case where the encapsulant is applied to amorphous thin-film silicon parts or the like or to the other parts at which the sunlight to reach the solar cell device is not so much blocked; however, in consideration of the photoelectric conversion efficiency of solar cells to which the encapsulant is applied or of the handleability of the encapsulant in laminating various parts therewith, the total light transmittance of the encapsulant is preferably 85% or more, more preferably 88% or more, even more preferably 90% or more.

The softness, the heat resistance and the transparency of the encapsulant (B) for use in the present invention may be often paradoxical properties. Concretely, when the crystallinity of the resin composition to be used is too much lowered for enhancing the softness thereof, then the heat resistance thereof may lower and may be therefore insufficient. On the other hand, when the crystallinity of the resin composition to be used is too much increased for increasing the heat resistance thereof, then the transparency may lower and may be therefore insufficient.

In consideration of the balance among these, when the storage elastic modulus (E') in dynamic viscoelasticity measurement at an oscillation frequency of 10 Hz and at a temperature of 20° C. is referred to as the index of softness, when the crystal melting peak temperature, as measured at a heating rate of 10° C./min in differential scanning calorimetry, of the olefin-based polymer is referred to as the index of heat resistance, and when the total light transmission is referred to as the index of transparency, it is desirable that these three indices are that the storage elastic modulus (E') is from 1 to 2000 MPa, the crystal melting peak temperature is 100° C. or higher and the total light transmission is 85% or higher, for the purpose of satisfying all those softness, heat resistance and transparency; and more preferably, the storage elastic modulus (E') is from 5 to 800 MPa, the crystal melting peak temperature is from 102 to 150° C. and the total light transmission is 85% or higher, even more preferably, the storage elastic modulus (E') is from 10 to 600 MPa, the crystal melting peak temperature is from 105 to 130° C. and the total light transmission is 88% or higher.

(Method for Producing Encapsulant (B))

Next described is a method for producing the encapsulant (B) for use in the present invention.

The form of the encapsulant is not specifically defined. The encapsulant may be liquid or may also be a sheet, but is preferably a sheet from the viewpoint of the handleability thereof.

As the film formation method for the sheet-like encapsulant, herein employable is a known method, for example, an extrusion casting method, a calendering method, an inflation method or the like using a melt mixing apparatus equipped with a single-screw extruder, a multi-screw extruder, a Banbury mixer, a kneader or the like and using a T-die. Though not specifically defined, in the present invention, preferred is an extrusion casting method using a T-die from the viewpoint of the handleability and the productivity. The molding temperature in the extrusion casting method using a T-die may be suitably controlled depending on the flow properties and the film formability of the resin composition to be used, but may be generally from 130 to 300° C., preferably from 150 to 250° C.

Not specifically defined, the thickness of the encapsulant is generally 0.03 mm or more, preferably 0.05 mm or more, more preferably 0.1 mm or more and is generally 1 mm or less, preferably 0.7 mm or less, more preferably 0.5 mm or less.

Various additives such as a silane coupling agent, an antioxidant, a UV absorbent, a weather-resistant stabilizer and the like may be previously dry-blended with resin and then fed into a hopper; or all the materials may be previously melt-mixed and pelletized, and then the pellets may be fed thereinto; or a master batch in which the additives alone are previously concentrated in resin may be prepared and fed into the production line. If desired, the surface and/or the back of the encapsulant that has been formed in the form of a sheet may be embossed or may be processed in any other mode to form various recesses or projections thereon (in conical, pyramid-like, semi-like or any other form), for the purpose of preventing the surfaces of the sheet from blocking together in rolling up the sheet or for the purpose of enhancing the handleability and the degassing operation in the lamination process for solar cell devices.

The surface of the encapsulant may be surface-treated variously through corona treatment, plasma treatment, primer treatment or the like from the viewpoint of enhancing the adhesiveness to various adherends. Here as a target for the surface treatment level, the treated surface preferably has a wettability index of 50 mN/m or more, more preferably 52 mN/m or more. The upper limit of the wettability index is generally 70 mN/m or so.

The encapsulant (B) for use in the present invention has a single-layer or laminate configuration, but preferably has a laminate configuration composed of multiple layers differing from each other in point of the constituent components therein and the compositional ratio of the constituent components for attaining the properties necessary for the encapsulant in a well-balanced manner, for example, as mentioned below. More preferably, the laminate configuration is formed in coextrusion through a multi-layer die of an extruder.

One example of the laminate configuration composed of multiple layers is a laminate configuration containing at least a soft layer and a hard layer as mentioned below. For example, the following laminate configurations are preferred here.

In this description, for example, the expression of A/B/C means that the layers are laminated in the order of A, B and C from the top (or from the bottom).
(1) Two-type three-layer configuration; concretely, soft layer/hard layer/soft layer, hard layer/soft layer/hard layer, adhesive layer/interlayer/adhesive layer, soft layer/regenerated added layer/soft layer, etc.;
(2) Two-type two-layer configuration; concretely, soft layer/hard layer, soft layer (I)/soft layer (II), adhesive layer/soft layer, adhesive layer/hard layer, soft layer (with additive)/soft layer (without additive), soft layer (with additive A)/soft layer (with additive B) (the additive formulation differs), etc.;
(3) Three-type three-layer configuration; concretely, soft layer/adhesive layer/hard layer, soft layer (I)/interlayer/soft layer (II), adhesive layer (I)/interlayer/adhesive layer (II), etc.;
(4) Three-type five-layer configuration; concretely, soft layer/adhesive layer/hard layer/adhesive layer/soft layer, hard layer/adhesive layer/soft layer/adhesive layer/hard layer, soft layer/regenerated added layer/hard layer/regenerated added layer/soft layer, soft layer/regenerated added layer/hard layer/regenerated added layer/hard layer, etc.

In the present invention, from the viewpoint of the balance of softness, heat resistance and transparency and of the economic efficiency, preferably used is the two-type three-layer configuration (1) such as typically soft layer/hard layer/soft layer, hard layer/soft layer/hard layer, adhesive layer/interlayer/adhesive layer, soft layer/regenerated added layer/soft layer, etc. Of the two-type three-layer configuration (1), especially preferred is a configuration of soft layer/hard layer/soft layer.

The interlayer is a provided from the viewpoint of increasing the thickness of the encapsulant (B) or enhancing the desired performance thereof, and is, for example, a layer formed of a resin composition containing an olefin-based resin as the main component thereof.

The regenerated added layer is provided from the viewpoint of economic rationality and effective utilization of natural resources, and is, for example, a layer formed of a resin composition prepared by regenerating the trimmings in film formation or slitting of the encapsulant (B).

The adhesive layer is provided from the viewpoint of enhancing the adhesiveness between the neighboring layers or the adhesiveness to adherends, and is, for example, a layer formed of a resin composition that contains a resin modified with a polar group such as a carboxyl group, an amino group, an imide group, a hydroxyl group, an epoxy group, an oxazoline group, a thiol group, a silanol group or the like, or a tackifier resin or the like. As the additive, there are mentioned a silane coupling agent, an antioxidant, a UV absorbent, a weather-resistant stabilizer, a light diffusing agent, a heat releasing agent, a nucleating agent, a pigment, a flame retardant, a discoloration inhibitor, a crosslinking agent, a crosslinking promoter, etc.

Here the soft layer is a layer having a storage elastic modulus (E') in dynamic viscoelastometry at an oscillation frequency of 10 Hz and at a temperature of 20° C., of preferably less than 100 MPa, more preferably from 5 to 50 MPa, and the hard layer is a layer having a storage elastic modulus (E') in dynamic viscoelastometry at an oscillation frequency of 10 Hz and at a temperature of 20° C., of preferably 100 MPa or more, more preferably from 200 to 800 MPa. Accordingly, of the two-type three-layer configuration of the above (1), especially preferred is soft layer/hard layer/soft layer. Employing the laminate configuration of the type is preferred as relatively easily realizing both the performance of protecting solar cell devices and the handleability (elastic modulus at room temperature, etc.) as a whole of the encapsulant. Satisfying both rigidity and softness at room temperature would make it possible to use thin-wall glass (for example, 1.1 mm) or a glassless configuration, therefore enabling further weight reduction.

The thickness of the soft layer to be kept in contact with a solar cell device is not specifically defined. In consideration of the performance to protect solar cell devices and the spreadability of resin, the thickness is preferably 0.005 mm or more, more preferably from 0.02 to 0.2 mm. In the above, the thickness of each soft layer may be the same or different. The thickness of the hard layer is not also specifically defined. From the viewpoint of the handleability of the entire encapsulant, the thickness is preferably 0.025 mm or more, more preferably from 0.05 to 0.8 mm.

Further, in producing the sheet-like encapsulant for use in the present invention, any other substrate film (for example, oriented polyester film (OPET), oriented polypropylene film (OPP), or various types of weather-resistant films such as ethylene tetrafluoride/ethylene copolymer (ETFE), polyvinylidene fluoride (PVDF), polyvinyl fluoride (PVF) or any other acrylic film, etc.) may be laminated on the encapsulant according to a method of extrusion lamination, coextrusion, sandwich lamination or the like.

By laminating the encapsulant (B) for use in the present invention with any other various types of substrate layers, the handleability of the resulting laminate may be enhanced, and the necessary properties and the economic potential of the laminate may be relatively readily controlled depending on the lamination ratio.

[Solar Cell Device (C)]

The solar cell device (C) for use in the present invention is not specifically defined. In general, at least one side of the device is arranged to be in contact with an encapsulant and is connected to others by wiring.

For example, there are mentioned single-crystal silicon-type, polycrystal silicon-type, amorphous silicon-type, gallium-arsenic, copper-indium-selenium, copper-indium-gallium-selenium, cadmium-tellurium or the like III-V group or II-VI group compound semiconductor-based, dye-sensitized type, organic thin film-type or the like solar cell devices. In the present invention, preferably used are single-crystal silicon-type and polycrystal silicon-type solar cells.

[Encapsulant (D)]

Not specifically defined, the encapsulant (D) for use in the present invention may be any one satisfying the requirement (P) described below, but is preferably the same type of encapsulant as the above-mentioned encapsulant (B). That is, it is desirable that the encapsulant (D) and the encapsulant (B) are the same in point of the other properties thereof and the constituent resin thereof except that they differ in point of the flow beginning temperature thereof to be mentioned below. Concretely, like the encapsulant (B), it is desirable that the encapsulant (D) contains an olefin-based polymer, especially, the aforementioned (b1) copolymer of ethylene and the α-olefin having from 3 to 20 carbon atoms, as the main component thereof. More preferably, both the encapsulant (B) and the encapsulant (D) contain, as the main component thereof, the olefin-based polymer. In addition, like in the encapsulant (B), the xylene soluble content, as measured according to ASTM 2765-95, in the encapsulant (D) is 70% by mass or more. More preferably, the encapsulant (B) and the encapsulant (D) both have a xylene soluble content, as measured according to ASTM 2765-95, of 70% by mass or more. Further, the encapsulant (D) may contain at least one additive selected from a silane coupling agent, an antioxidant, a UV absorbent and a weather-resistant stabilizer. At least one of the encapsulant (B) and the encapsulant (D) preferably contains at least one additive selected from a silane coupling agent, an antioxidant, a UV absorbent and a weather-resistant stabilizer.

The encapsulant (D) on the side of the back sheet is positioned on the back side of the solar cell device (C), and therefore the transparency (total light transmittance) thereof is not often so much considered to be important as compared with that of the encapsulant (B) to be provided on the side of the upper protective material. In one preferred embodiment of the configuration, a white pigment may be added to the encapsulant (D) so as to impart light reflectivity to the material. In this embodiment, the light having fallen on the side of the upper protective material of the solar cell module and having partly passed through the solar cell device could be reflected and could again come in the solar cell device for effective utilization of light as the main purpose of the embodiment. Moreover, the material may be colored in different colors, for example, through black coloration, blue coloration or the like to thereby impart light shieldability thereto, and in those embodiments, the design performance and the decoration performance of the solar cell modules to be produced can be thereby further enhanced.

As the white pigment, there are mentioned metal oxides such as titanium oxide, zinc oxide, silicon oxide, aluminium oxide, etc.; and other inorganic compounds such as calcium carbonate, barium sulfate, etc. One alone or two or more different types of these white pigments may be used here either singly or as combined. In the present invention, preferred is use of titanium oxide, zinc oxide, calcium carbonate. More preferred is titanium oxide as capable of efficiently imparting light reflectivity even though its amount added is small.

For increasing the power generation efficiency by light reflection, it is desirable that the mean value of the reflectance at from 500 to 700 nm, at which ordinary solar cells have an absorption intensity, is 50% or more, more preferably 70% or more, even more preferably 80% or more, still more preferably 90% or more.

[Back Sheet (E)]

The back sheet (E) for use in the present invention is not specifically defined.

Concretely, a substrate sheet (or a substrate film) is formed of an electrically-insulating material of a polyester resin (polyethylene terephthalate (PET), polyethylene naphthalate (PEN), etc.), a fluororesin (polytetrafluoroethylene (PTFE), tetrafluoroethylene-perfluoroalkyl vinyl ether copolymer (PFA), tetrafluoroethylene-hexafluoropropylene copolymer (FEP), ethylene-tetrafluoroethylene copolymer (ETFE), polychlorotrifluoroethylene (PCTFE), polyvinylidene fluoride (PVDF), polyvinyl fluoride (PVF), etc.), a polyolefin resin (polyethylene (PE), polypropylene (PP), various α-olefin copolymer, ethylene-vinyl acetate copolymer (EVA), ethylene-ethyl acrylate copolymer (EEA), ethylene-acrylic acid copolymer (EAA), ethylene-methacrylic acid copolymer (EMAA), etc.), a cyclic olefin resin (COP, COC, etc.), a polystyrene resin (acrylonitrile-styrene copolymer (AS), acrylonitrile-butadiene-styrene copolymer (ABS), acrylonitrile-styrene-acrylic rubber copolymer (ASA), syndiotactic polystyrene (SPS), etc.), polyamide (PA), polycarbonate (PC), polymethyl methacrylate (PMMA), modified polyphenylene ether (modified PPE), polyphenylene sulfide (PPS), polyether sulfone (PES), polyphenyl sulfone (PPSU), polyether ether ketone (PEEK), polyether imide (PEI), polyimide (PI), a biopolymer (polylactic acid, isosorbide polymer, polyamide polymer, polyester polymer, polyolefin polymer, etc.), etc.

In the present invention, polyester resin, polyolefin resin and fluororesin are preferred as the material for the substrate sheet, from the viewpoint of the adhesiveness to encapsulant, the mechanical strength, the durability and the economic efficiency thereof.

The production method for the substrate sheet or the substrate film is not specifically defined. Typically there are mentioned an extrusion casting method, a stretching method, an inflation method, a casting method, etc.

For improving the handleability, the durability and the light reflectivity thereof and from the viewpoint of the economic efficiency of the substrate sheet, any other resin and various additives may be added to the sheet, if desired. The additives include, for example, an antioxidant, a UV absorbent, a weather-resistant stabilizer, a light diffusing agent, a nucleating agent, a pigment (for example, titanium oxide, barium sulfate, carbon black, etc.), a flame retardant, a discoloration inhibitor, a hydrolysis inhibitor, a heat-releasing agent, etc.

Further, if desired, the surface and/or the back of the substrate sheet may be embossed or may be processed or may be processed variously (for corona treatment, plasma treatment, etc.) or may be coated (fluororesin coating, hydrolysis-resistant coating, hard coating, etc.), for improving the handleability, the adhesiveness and the durability of the sheet.

The back sheet (E) for use in the present invention may have a single-layer or laminate configuration including the substrate sheet, but preferably has a laminate structure for attaining the necessary properties for the back sheet in a well-balanced manner.

The properties that are generally necessary for back sheet include adhesiveness to encapsulant, mechanical strength, durability (weather resistance, hydrolysis resistance, etc.), light reflectivity, water vapor barrier property, flame resistance, design performance, economic efficiency, good appearance after lamination, etc. Above all, in the case of crystal silicon-based solar cell modules, adhesiveness to encapsulant, mechanical strength, durability, economic efficiency and good appearance after lamination are considered to be specifically important for the back sheet.

For attaining these properties in a well-balanced manner, laminate configurations mentioned below are preferred for the back sheet (E) for use in the present invention. Here, the adhesive layer is a layer for improving the adhesiveness between the layers of the back sheet (E), and is not specifically defined. For example, preferred are a polyurethane adhesive, a polyester adhesive, a resin modified with a polar group, etc. The adhesion-improving layer to be mentioned below is mainly a layer for improving the adhesiveness to encapsulant and is not specifically defined. For example, favorably used are an ethylene-vinyl acetate copolymer, a polyethylene resin, a polypropylene resin, etc.

(1) A fluororesin layer/adhesive layer/polyester resin layer/adhesive layer/adhesion-improving layer (encapsulant side); concretely, PVF/adhesive layer/biaxially-oriented PET/adhesive layer/EVA, PVF/adhesive layer/biaxially-oriented PET/adhesive layer/PE, PVF/adhesive layer/biaxially-oriented PET/adhesive layer/PP, ETFE/adhesive layer/biaxially-oriented PET/adhesive layer/EVA, ETFE/adhesive layer/biaxially-oriented PET/adhesive layer/PE, PTFE/adhesive layer/biaxially-oriented PET/adhesive layer/PP, etc.

(2) Polyester resin layer/adhesive layer/polyester resin layer/adhesive layer/adhesion-improving layer (encapsulant side); concretely biaxially-oriented PET (processed for resistance to hydrolysis)/adhesive layer/biaxially-oriented PET/adhesive layer/EVA, biaxially-oriented PET (processed for resistance to hydrolysis)/adhesive layer/biaxially-oriented PET/adhesive layer/PE, biaxially-oriented PET (processed for resistance to hydrolysis)/adhesive layer/biaxially-oriented PET/adhesive layer/PP, (surface-coated) biaxially-oriented PET/adhesive layer/biaxially-oriented PET/adhesive layer/adhesion-improving layer, etc.

(3) Polyester resin layer/adhesive layer/adhesion-improving layer (encapsulant side); concrete, biaxially-oriented PET (processed for resistance to hydrolysis)/adhesive layer/EVA, biaxially-oriented PET (processed for resistance to hydrolysis)/adhesive layer/PE, biaxially-oriented PET (processed for resistance to hydrolysis)/adhesive layer/PP, (surface-coated) biaxially-oriented PET/adhesive layer/adhesion-improving layer, etc.

In the above (1) to (3), the adhesive layer may be arranged, if desired. In these, the adhesive layer may be omitted. In case where the water vapor barrier property is considered to be specifically important for the sheet, for example, the above-mentioned configuration of the sheet, biaxially-oriented PET (processed for resistance to hydrolysis)/adhesive layer/biaxially-oriented PET/adhesive layer/PE may be modified to biaxially-oriented PET (processed for resistance to hydrolysis)/adhesive layer/vapor-deposition layer (SiOx, alumina, etc.)/biaxially-oriented PET/adhesive layer/biaxially-oriented PET)/adhesive layer/PE, etc.

The crystal melting peak temperature (Tm) of the adhesion-improving layer is generally 80° C. or higher and 165° C. or lower. In the present invention, the lower limit of the crystal melting peak temperature (Tm) of the adhesion-improving layer is preferably 95° C., more preferably 100° C., from the viewpoint of the adhesiveness to the encapsulant (D), the economic efficiency, the appearance of solar cell modules and the heat resistance of the adhesion-improving layer itself. On the other hand, the upper limit is preferably 140° C., more preferably 125° C.

The total thickness of the back sheet (E) for use in the present invention is not specifically defined, and may be suitably selected in consideration of the desired performance thereof. Typically the total thickness could be 50 m or more and 600 μm or less, preferably 150 μm or more and 400 μm or less. For satisfying the dielectric breakdown voltage of 1 kV or more, the total thickness is preferably 200 μm or more, more preferably 250 μm or more.

[Flow Beginning Temperature of Encapsulants (B) and (D)]

In the solar cell module of the present invention, it is important that the encapsulant (B) for use on the side of the upper protective material and the encapsulant (D) for use on the side of a back sheet satisfy the following requirement (P):

Requirement (P): The flow beginning temperature (TB) (° C.) of the encapsulant (B) and the flow beginning temperature (TD) (° C.) of the encapsulant (D), as measured under a load of 1 kgf/cm², have the following relationship:

$$TB-TD>0 \text{ (° C.)}$$

Here the flow beginning temperature of each encapsulant is measured under the condition mentioned below. Specifically, using a Koka-type flow tester by Shimadzu, trade name "Flow Tester CFT-500C", a sample is analyzed through a nozzle (inner diameter 1 mm, length 2 mm) at a heating rate of 3° C./min under a load of 1 kgf/cm² (9.8×10⁴ Pa) to determine the flow beginning temperature (Tfb) of the encapsulant. In case where the value of Tfb is not automatically expressed, the flow beginning temperature could be read from the stroke chart of the flow tester.

In the present invention, when the encapsulant (B) for use on the upper protective material side and the encapsulant (D) for use on the back sheet side satisfy the above requirement (P), then the case is favorable in which the back sheet surface is prevented from showing the projection phenomenon after lamination into a solar cell module and the solar cell module can have a good appearance.

In the present invention, the mechanism of developing the projection phenomenon on the back sheet surface could be presumed as follows: Here, a typical solar cell module having a configuration of upper protective material (A)/ encapsulant (B)/solar cell device (C)/encapsulant (D)/back sheet (E) is described as an example.

In a typical lamination process, first from the bottom, the members are laid out in the order of upper protective material (A)/encapsulant (B)/solar cell device (simply referred to as cell) (C)/encapsulant (D)/back sheet (E). Next, while heated with a heat source of a vacuum laminator positioned on the side of the upper protective material (A) (as one example, herein used is a laminator having a heat source such as an electric heater, an oil heater or the like on one side thereof), this is processed in a vacuum step (time: 1 to 15 minutes or so) and a pressing step (time: 3 to 20 minutes or so, pressure: 10 to 100 kPa or so), and the module is thus discharged out and cooled.

Here, the flowability of the encapsulant (B) for use on the side of the upper protective material (A) and that of the encapsulant (D) for use on the side of the back sheet (E) in the pressing step are investigated. The heat source is generally positioned on the side of glass (upper protective material), and therefore the encapsulant (B) is heated earlier than the encapsulant (D). The preliminary experiment made by the present inventors confirmed that the temperature indicated by the thermocouple arranged at the position of the encapsulant (D) was lower by about 15° C. or so than the temperature indicated by the thermocouple arranged at the position of the encapsulant (B), before the lapse of time of from 5 to 10 minutes after the start of heating in the vacuum step set at 130° C. For example, in a case where the encapsulant (B) and the encapsulant (D) are encapsulants having the same flow properties, the encapsulant (B) that is heated faster should have a lower viscosity than that of the encapsulant (D). When a pressure is given to the system in that state, then the flow of the encapsulant between the cell and the cell could run in the direction from the encapsulant (B) toward the encapsulant (D). In general, the wire (lead wire) to connect cells to each other shall have a part (10 to 20 mm or so) not adhering to the cell, and therefore, when the flowing force from the encapsulant (B) toward the encapsulant (D) increases, then the wire to connect the cells to each other would rise up on the side of the back sheet and may therefore readily deform in a downturning form and the encapsulant may readily flow in the area of the non-adhering part between the wire and the cell on the side of the back sheet, and these would appear as the projection phenomenon on the back sheet surface. From these matters, it is considered that, when at least the flow beginning temperature (TB) of the encapsulant (B) for use on the side of the upper protective material (A) is higher than the flow beginning temperature (TD) of the encapsulant (D) for use on the side of back sheet (that is, TB>TD), then the encapsulant flow could be inhibited.

Accordingly, in the present invention, it is important that the difference between the flow beginning temperature (TB) (° C.) of the encapsulant (B) and the flow beginning temperature (TD) (° C.) of the encapsulant (D) (TB−TD) (hereinafter this may be expressed as a flow beginning temperature difference) is higher than 0° C. When the flow beginning temperature difference is 0° C. or lower, the flow of the encapsulant (B) toward the encapsulant (D) could not be prevented and therefore the projection phenomenon could not also be prevented.

The lower limit of the flow beginning temperature difference is preferably 15° C., more preferably 20° C., even more preferably 25° C. The upper limit is preferably 50° C., more preferably 40° C.

The flow beginning temperature difference falling within the range secures the adhesiveness in the solar cell module after lamination and prevents the projection phenomenon on the back sheet surface and, in addition, the solar cell module has few recesses between the cells and secures the flatness of the back sheet surface, and therefore the case is preferred as readily having a good appearance. In the present invention, the reason why the load in measuring the flow beginning temperature is 1 kgf/cm$^2$ is because the maximum pressure of a general vacuum laminator to be used in the pressing step is 100 kPa (about 1 kgf/cm$^2$).

Preferably, the requirement (P) is the following requirement (P-1), more preferably the following requirement (P-2).

Requirement (P-1): The flow beginning temperature (TB) (° C.) of the encapsulant (B) and the flow beginning temperature (TD) (° C.) of the encapsulant (D), as measured under a load of 1 kgf/cm$^2$, have the following relationship:

$$50\ (°\ \text{C.}) \geq TB - TD \geq 15\ (°\ \text{C.})$$

Requirement (P-2): The flow beginning temperature (TB) (° C.) of the encapsulant (B) and the flow beginning temperature (TD) (° C.) of the encapsulant (D), as measured under a load of 1 kgf/cm$^2$, have the following relationship:

$$40\ (°\ \text{C.}) \geq TB - TD \geq 20\ (°\ \text{C.})$$

Next, the flow beginning temperature (TD) of the encapsulant (D) for use on the back sheet side in the present invention is preferably 100° C. or higher, more preferably 105° C. or higher, even more preferably 110° C. or higher.

The relationship between the flow beginning temperature (TB) (° C.) of the encapsulant (B) and the flow beginning temperature (TD) (° C.) of the encapsulant (D) is TB−TD>0 (° C.). Therefore, when TD=100° C., then TB>100° C.; when TD=105° C., TB>105° C.; and when TD=110° C., TB>110° C. Here when the flow beginning temperature of each encapsulant falls within the range, it is especially favorable since the solar cell module in which the encapsulant does not substantially crosslink can satisfy both heat resistance and good appearance.

[Method of Controlling Flow Beginning Temperature of Encapsulant]

Next described is a method of controlling the flow beginning temperature of encapsulant. The flow beginning temperature of encapsulant is influenced by the molecular weight, the molecular weight distribution, the thixotropy and the crosslinking degree of the resin composition to constitute the encapsulant. In general, when the molecular weight is higher, then the flow beginning temperature is also higher. When the molecular weight distribution is broad, the composition could not flow at once but the part thereof having a lower molecular weight starts to flow partially. The flow beginning temperature as referred to in the present invention is a value of Tfb measured with an a Koka-type flow tester and is a temperature at which a polymer sample starts to flow via a rubbery flat state in a rheological behavior thereof.

In the present invention, it is desirable the flow beginning temperature of the encapsulant is controlled by the melt flow rate (MFR) thereof for facilitating the material planning for the resin composition to constitute the encapsulant. A sample having a lower MFR value shall have a higher flow beginning temperature; and a sample having a higher MFR value shall have a lower flow beginning temperature. Mixing two or more different types of resins each having a different MFR value to adjust or control the flow beginning temperature of the resulting mix is also a preferred embodiment here.

[Method for Producing Solar Cell Module]

In the method for producing the solar cell module of the present invention, it is important that the encapsulant (B) and the encapsulant (D) to be used in the method differ in point of the flow beginning temperature (TB) (° C.) of the former and the flow beginning temperature (TD) (° C.) of the latter, as measured under a load of 1 kgf/cm$^2$, and that the encapsulant having a higher flow beginning temperature is arranged on the side of the heat source in lamination.

As described above, in lamination to produce a solar cell module, the encapsulant positioned on the heat source side is heated earlier to be more fluid so that it is considered that the thus-fluidized encapsulant moves toward the other encapsulant to thereby cause the projection phenomenon on the back sheet surface.

Consequently, in the production method of the solar cell module of the present invention, the encapsulant having a higher flow beginning temperature (° C.), as measured under a load of 1 kgf/cm$^2$, is positioned on the side of the heat source so that one encapsulant is prevented from flowing toward the other encapsulant to thereby prevent the projection phenomenon.

The heat source of the laminator in thermal adhesion under pressure is preferably positioned on the side of the upper protective material (A) in view of the configuration of the production line. Consequently, in the production method for the solar cell module of the present invention, it is desirable that the flow beginning temperature (TB) (° C.) of the encapsulant (B) for use on the side of the upper protective material (A) is higher than the flow beginning temperature (TD) (° C.) of the encapsulant (D), and it is desirable that the encapsulant (B) is arranged on the side of the heat source.

In the present invention, the heat source may be on one side (for example, on the side of the upper protective material), or may be on both sides (on both the upper protective material side and the back sheet side). In case where the heat source is arranged on both the upper protective material side and the back sheet side, the heat source of which the temperature is higher in lamination is considered as the "heat source" in the present invention, and it is desirable that the encapsulant (B) having a higher flow beginning temperature is arranged on the side of the heat source that is heated earlier.

In the production method for the solar cell module of the present invention, the preset lamination temperature at which the constituent members are laminated is generally from 100 to 170° C., and for preventing the solar cell device (cell) from being thermally degraded, the temperature is preferably from 100 to 135° C.

In the present invention, the "preset lamination temperature" is a preset temperature of the laminator with which the upper protective material (A), the encapsulant (B) for use on the side of the upper protective material (A), the solar cell device (C), the encapsulant (D) for use on the side of a back sheet (E) and the back sheet (E) are laminated and bonded together under heat and pressure, or that is, the temperature of the heat source in the laminator apparatus. The preset lamination temperature of 100° C. or higher favorably secures good adhesion to glass and back sheet. On the other hand, the temperature of 135° C. or lower can prevent the cells from being thermally degraded and can further prevent the projection phenomenon on the back sheet, thereby favorably providing a good appearance of the produced module. In consideration of other properties, it would be effective to attain the lamination within a possibly shorter period of time (for example, in a vacuuming period of from 3 to 5 minutes and a pressing period of from 5 to 10 minutes, etc.).

In case where a laminator having a heat source on both sides thereof is used, the preset temperature of the heat source having a higher temperature (hereinafter this may be referred to as "high-temperature heat source") in lamination may be generally from 100 to 170° C. or so, though not specifically defined, and preferably from 100 to 135° C. The preset temperature of the heat source having a lower temperature in lamination is not specifically defined, so far as it is lower than the preset temperature of the high-temperature heat source.

To the production method for the solar cell module, applicable to any known production method except for the above-mentioned, preset lamination temperature, though not specifically defined, in general, the method includes a step of laminating the upper protective material (A), the encapsulant (B), the solar cell device (C), the encapsulant (D) and the back sheet (E) in that order to give a laminate configuration, and a step of bonding them under heat and pressure through vacuum suction at the preset lamination temperature. To the method, also applicable are a batch-type production apparatus, a roll-to-roll type production apparatus, etc.

[Solar Cell Module]

The solar cell module of the present invention is a solar cell module that contains the upper protective material (A), the encapsulant (B) for use on the side of the upper protective material (A), the solar cell device (C), the encapsulant (D) for use on the side of a back sheet (E) and the back sheet (E).

Concretely, the solar cell module of the type has a configuration of upper protective material/encapsulant (encapsulant resin layer)/solar cell device/encapsulant (encapsulant resin layer)/lower protective layer, in which the solar cell device is sandwiched between the encapsulants on both sides thereof (see FIG. 1).

As shown in FIG. 1, the upper protective material (A) 10, the encapsulant (B) 12A, the solar cell devices (C) 14A and 14B, the encapsulant (D) 12B and the back sheet (E) 16 are laminated in that order from the sunlight-receiving side thereof, and to the lower surface of the back sheet (E) 16, adhered is a junction box 18 (terminal box for connecting a wiring for taking out the generated electricity from the solar cell device). The solar cell devices (C) 14A and 14B are connected by the wiring 20 for electrically leading the generated current to the outside. The wiring 20 is taken to the outside via the through-hole (not shown) formed in the back sheet (E) 16, and is connected to the junction box 18.

The solar cell module of the present invention is usable in various applications irrespective of indoor use or outdoor use, for example, for small-size solar cells such as typically those in mobile instruments, as well as large-size solar cells to be installed on roofs or rooftop decks, depending on the type of the solar cell and the module form to be applied thereto. However, the problem of generation of the projection phenomenon and the problem of poor appearance to which the present invention is directed would hardly occur in small-size modules but often occur especially in large-size modules, and therefore, the present invention is more effective in modules, for example, having a size of 90 cm×90 cm or more, especially a size of 90 cm×100 cm or more.

EXAMPLES

The present invention is described in more detail with reference to the following Examples, however, the present invention is not limited at all by these Examples. The products described in the specification were analyzed for their data and evaluations, as mentioned below. In this, the sheet running direction from extruder is referred to as a machine direction (MD), and the direction perpendicular to that direction is referred to as a transverse direction (TD).

[Method for Measurement and Evaluation]

(1) Crystal Melting Peak Temperature (Tm)

Using a differential scanning calorimeter (Perkin Elmer's trade name "Pyris1 DSC") and according to JIS K7121, about 10 mg of a sample was heated from −40° C. to 200° C. at a heating rate of 10° C./min, kept at 200° C. for 1 minutes, and then cooled down to −40° C. at a cooling rate of 10° C./min, and again this was heated up to 200° C. at a heating rate of 10° C./min, and on the thermogram thus drawn through the cycle, the crystal melting peak temperature (Tm) (° C.) was read.

(2) Heat of Crystal Fusion (ΔHm)

Using a differential scanning calorimeter (Perkin Elmer's trade name "Pyris1 DSC") and according to JIS K7122, about 10 mg of a sample was heated from −40° C. to 200° C. at a heating rate of 10° C./min, kept at 200° C. for 1 minute, and then cooled down to −40° C. at a cooling rate of 10° C./min, and again this was heated up to 200° C. at a heating rate of 10° C./min, and on the thermogram thus drawn through the cycle, the heat of crystal fusion (ΔHm) (J/g) was read.

(3) Thermal Shrinkage Rate

The back sheet (E) to be used was cut into a sample having a size of 150 mm in length and 150 mm in width, and in the center of the surface thereof on the encapsulant side, a cross mark having a size of 100 mm in length and 100 mm in width was drawn with an oily pen. Three samples of the same type were prepared. Next, these were left in a hot air oven at 150° C. for 30 minutes, and the degree of shrinkage of the cross mark in the machine direction (MD) was measured relative to the original dimension thereof before shrunk. The data were averaged to give the mean value (%) of the thermal shrinkage rate.

(4) Storage Elastic Modulus (E')

Using IT Measurement's viscoelasticity meter, trade name "Viscoelasticity Spectrometer DVA-200", a sample (4 mm in length, 60 mm in width) was analyzed in the transverse direction, at an oscillation frequency of 10 Hz, at a strain of 0.1%, at a heating rate of 3° C./min and at a chuck-to-chuck distance of 25 mm, in a range from −150° C. to 150° C., and from the found data, the storage elastic modulus (E') (MPa) at 20° C. of the sample was obtained.

(5) Flow Beginning Temperature

Using Shimadzu's a Koka-type flow tester, trade name "Flow Tester CFT-500C", a sample was analyzed through a nozzle (inner diameter 1 mm, length 2 mm) at a heating rate of 3° C./min under a load of 1 kgf/cm$^2$ (9.8×10$^4$ Pa) to determine the flow beginning temperature (Tfb) of the encapsulant.

(6) Appearance of Laminate

Using a vacuum laminator (NPC's trade name SLM-240× 460) and at a preset lamination temperature shown in Table 1, and using the encapsulant (B), the encapsulant (D) and the back sheet (E), three solar cell modules each having a configuration of upper protective material (A)/encapsulant (B)/solar cell device (C)/encapsulant (D)/back sheet (E) were produced under the condition mentioned below; and the appearance of the laminate was evaluated (in point of (i) projection phenomenon, (ii) flatness and (iii) comprehensive evaluation).

(i) Projection Phenomenon

The number of projections formed on the surface of the back sheet of the three solar cell modules was counted in each module, and the found data were averaged to give the mean value. Based on the criteria mentioned below, each sample was evaluated.

(A) Few projections were seen (0 to 5 projections).

(B) Some but small projections were seen (6 to 15 projections).

(C) Many high projections were seen (16 projections or more).

(ii) Flatness

The mean state of the appearance between the cells on the surface of the back sheet of the three solar cell modules was evaluated according to the criteria mentioned below.

(A) Few recesses or wiring streaks were seen between the cells, and the flatness of the back sheet surface was good.

(B) Some recesses or wiring streaks were seen between the cells, but the flatness of the back sheet surface was basically good.

(C) Large recesses between the cells were seen and the wiring streaks therebetween were visible, and the entire solar cell module had a chocolate tablet-like appearance.

(iii) Comprehensive Evaluation

Comprehensive evaluation of the appearance of the laminate was made according to the following criteria.

(A) Both the projection phenomenon and the flatness are given the evaluation B or the evaluation A.

(C) The projection phenomenon and/or the flatness are given the evaluation C.

[Encapsulant]

The materials to constitute encapsulants are shown below.

(Ethylene-α-Olefin Random Copolymer)

(X-1): Ethylene-octene random copolymer (Dow Chemical's trade name AFFINITY EG8100G, density: 0.870 g/cm$^3$, ethylene/1-octene=68/32% by mass (89/11% by mol), Tm: 59° C., ΔHm: 49 J/g, storage elastic modulus (E') at 20° C.: 14 MPa, MFR (temperature: 190° C., load 21.18 N): 1 g/10 min)

(X-2): Ethylene-octene random copolymer (Dow Chemical's trade name AFFINITY EG8200G, density: 0.870 g/cm$^3$, ethylene/1-octene=68/32% by mass (89/11% by mol), Tm: 59° C., ΔHm: 49 J/g, storage elastic modulus (E') at 20° C.: 14 MPa, MFR (temperature: 190° C., load 21.18 N): 5 g/10 min)

(X-3): Ethylene-octene random copolymer (Dow Chemical's trade name ENGAGE 8130, density: 0.864 g/cm$^3$, ethylene/1-octene=65/35% by mass (88/12% by mol), Tm: 49° C., ΔHm: 38 J/g, storage elastic modulus (E') at 20° C.: 10 MPa, MFR (temperature: 190° C., load 21.18 N): 13 g/10 min)

(X-4): Ethylene-octene random copolymer (Prime Polymer's trade name EVOLUE SP00108, density: 0.898 g/cm$^3$, ethylene/1-octene=82/18% by mass (95/5% by mol), Tm: 95° C., ΔHm: 73 J/g, storage elastic modulus (E') at 20° C.: 73 MPa, MFR (temperature: 190° C., load 21.18 N): 10 g/10 min)

(X-5): Ethylene-butene random copolymer (Prime Polymer's trade name NEOZEX 0234N, density: 0.919 g/cm$^3$, ethylene/1-butene=93/7% by mass (96/4% by mol), Tm: 118° C., ΔHm: 127 J/g, storage elastic modulus (E') at 20° C.: 430 MPa, MFR (temperature: 190° C., load 21.18 N): 2 g/10 min)

(Silane-Modified Ethylene-Based Resin)

(Q-1): Silane-modified ethylene-octene random copolymer (Mitsubishi Chemical's trade name: LINKLON SL800N, density: 0.868 g/cm$^3$, Tm: 54° C. and 116° C., ΔHm: 22 J/g and 4 J/g, storage elastic modulus (E') at 20° C.: 15 MPa, MFR (temperature: 190° C., load 21.18 N): 1.7 g/10 min)

(Q-2): Silane-modified ethylene-hexene random copolymer (Mitsubishi Chemical's trade name: LINKLON XLE815N, density: 0.915 g/cm$^3$, Tm: 122° C., ΔHm: 100 J/g, storage elastic modulus (E') at 20° C.: 282 MPa, MFR (temperature: 190° C., load 21.18 N): 0.5 g/10 min)

(Ethylene-α-Olefin Block Copolymer)

(R-1): Ethylene-octene block copolymer (Dow Chemical's trade name: INFUSE 9000, density: 0.875 g/cm$^3$, ethylene/1-octene=65/35% by mass (88/12% by mol), Tm: 122° C., ΔHm: 44 J/g, storage elastic modulus (E') at 20° C.: 27 MPa, MFR (temperature: 190° C., load: 21.18 N): 0.5 g/10 min)

The encapsulants used in Examples are shown below.

(B-1): As a layer (I), used was a resin mixture prepared by mixing 65 parts by mass of the above (X-1), 35 parts by mass of (X-2) and 15 parts by mass of (Q-1), and as a layer (II), used was a resin mixture prepared by mixing 65 parts by mass of (X-1), 35 parts by mass of (X-2) and 5 parts by mass of (R-1). These were laminated in a mode of coextrusion molding to give a laminate configuration of layer (I)/layer (II)/layer (I), according to a T-die method using a unidirectional double-screw extruder at a resin temperature of from 180 to 200° C., and then rapidly cooled using a casting emboss roll at 25° C. to give an encapsulant sheet having a total thickness of 0.50 mm, in which the thickness of each layer was (I)/(II)/(I)=0.05 mm/0.40 mm/0.05 mm.

(B-2): In the same manner as that for (B-1), in which, except for using a resin composition prepared by mixing 85 parts by mass of the above (X-1), 15 parts by mass of (X-3) and 15 parts by mass of (Q-1) was used as the layer (I) and a resin composition prepared by mixing 85 parts by mass of (X-1), 15 parts by mass of (X-3) and 5 parts by mass of (R-1) was used as the layer (II), an encapsulant sheet having a total thickness of 0.50 mm was produced, in which the thickness of each layer was (I)/(II)/(I)=0.05 mm/0.40 mm/0.05 mm.

(D-1): In the same manner as that for (B-1), in which, except for using a resin composition prepared by mixing 100 parts by mass of the above (X-2) and 15 parts by mass of (Q-1) was used as the layer (I) and a resin composition prepared by mixing 100 parts by mass of (X-2) and 5 parts by mass of (R-1) was used as the layer (II), an encapsulant sheet having a total thickness of 0.50 mm was produced, in which the thickness of each layer was (I)/(II)/(I)=0.05 mm/0.40 mm/0.05 mm.

(D-2): In the same manner as that for (B-1), in which, except for using a resin composition prepared by mixing 100 parts by mass of the above (X-2) and 15 parts by mass of (Q-1) was used as the layer (I) and a resin composition prepared by mixing 100 parts by mass of (X-2), 5 parts by mass of (R-1) and 10 parts by mass of titanium oxide was used as the layer (II), an encapsulant sheet having a total thickness of 0.50 mm was produced, in which the thickness of each layer was (I)/(II)/(I)=0.05 mm/0.40 mm/0.05 mm. The light reflectance of the encapsulant sheet was 90% or more.

(D-3): In the same manner as that for (B-1), in which, except for using a resin composition prepared by mixing 100 parts by mass of the above (X-4) and 25 parts by mass of (Q-2) was used as the layer (I) and a resin composition prepared by mixing 80 parts by mass of (X-4) and 20 parts by mass of (X-5) was used as the layer (II), an encapsulant sheet having a total thickness of 0.50 mm was produced, in which the thickness of each layer was (I)/(II)/(I)=0.05 mm/0.40 mm/0.05 mm.

[Back Sheet]

Back sheets used in Examples are shown below.

(E-1): Madico's back sheet, trade name Protekt HD (total thickness: 260 μm, laminate configuration: (encapsulant side) EVA/adhesive layer/PET/coat layer, thermal shrinkage rate (150° C.×30 min, MD): 1.41%, Tm (EVA layer): 104° C.)

(E-2): TAIFLEX's back sheet, trade name Solmate TPE BTNE (total thickness: 280 μm, laminate configuration: (encapsulant side) EVA/adhesive layer/PET/adhesive layer/PVF (white: containing titanium oxide), thermal shrinkage rate (150° C.×30 min, MD): 1.12%, Tm (EVA layer): 103° C.)

(E-3): Coveme's back sheet, trade name dyMat PYE (total thickness: 295 μm, laminate configuration: (encapsulant side) EVA/EVA (white: containing titanium oxide)/EVA/adhesive layer/PET/adhesive layer/PET (white: containing barium sulfate), thermal shrinkage rate (150° C.×30 min, MD): 1.40%, Tm (EVA layer): 103° C.)

Example 1

Using a vacuum laminator (NPC's trade name: SLM-240×460), the members mentioned below and shown in Table 1 were combined in the order indicated below, and the resulting structure was laminated under the lamination condition mentioned below. Three such solar cell modules were produced, and the appearance thereof after lamination was evaluated. The results are shown in Table 1.

<Configuration>

Upper protective material (A)/encapsulant (B)/solar cell device (C)/encapsulant (D)/back sheet (E)

<Constituent Members>

Upper protective material (A): Nakajima Glass Industry's white embossed cover glass for solar cells,
trade name SOLECT, size 996 mm×1664 mm, thickness 3.2 mm Solar Cell Device (C): Q Cell Japan's solar cell unit, trade name Q6LTT3-G2-180 (6 inches, 3 bus bar-type),
Number of cells: 60 (6 lines×10 cells).
When the number of cells is 60, there is a possibility that projections would occur in at most 120 sites.

Wiring: Hitachi Cable Fine Tech's PV wire
trade name NoWarp, SSA-SPS 0.2×2.0
(0.2% proof strength, 56 to 57 MPa)

Encapsulant (B): B-1
Encapsulant (D): D-1
The size of the encapsulant (B) and the encapsulant (D) is the same as that of the above-mentioned glass (that is, the size is 996 mm×1664 mm).

Back sheet (E): E-1

<Lamination Condition>

Preset lamination temperature: 125° C.
Vacuuming time: 3 min
Pressing time: 5 min
Pressure condition: 70 kPa
Pressure rising rate: 0.5 kPa/sec
Cooling fan: not used Example 2

In the same manner as in Example 1 except for changing the back sheet (E) from E-1 to E-2, three solar cell modules were produced and evaluated for the lamination appearance. The results are shown in Table 1.

Example 3

In the same manner as in Example 2 except for changing the preset lamination temperature from 125° C. to 135° C., three solar cell modules were produced and evaluated for the lamination appearance. The results are shown in Table 1.

Example 4

In the same manner as in Example 1 except for changing the encapsulant (B) on the upper protective material side from B-1 to B-2, three solar cell modules were produced and evaluated for the lamination appearance. The results are shown in Table 1.

Example 5

In the same manner as in Example 4 except for changing the back sheet (E) from E-1 to E-2, three solar cell modules were produced and evaluated for the lamination appearance. The results are shown in Table 1.

Example 6

In the same manner as in Example 5 except for changing the preset lamination temperature from 125° C. to 135° C., three solar cell modules were produced and evaluated for the lamination appearance. The results are shown in Table 1.

Example 7

In the same manner as in Example 1 except for changing the encapsulant (D) on the back sheet side from D-1 to D-2, three solar cell modules were produced and evaluated for the lamination appearance. The results are shown in Table 1.

Example 8

In the same manner as in Example 1 except for changing the encapsulant (B) on the upper protective material side from B-1 to B-2 and changing the encapsulant (D) on the back sheet side from D-1 to D-2, three solar cell modules were produced and evaluated for the lamination appearance. The results are shown in Table 1.

Example 9

In the same manner as in Example 1 except for changing the encapsulant (D) on the back sheet side from D-1 to D-3, changing the preset lamination temperature from 125° C. to 135° C. and changing the back sheet (E) from E-1 to E-3, three solar cell modules were produced and evaluated for the lamination appearance. The results are shown in Table 1.

Example 10

In the same manner as in Example 9 except for changing the preset lamination temperature from 135° C. to 145° C., three solar cell modules were produced and evaluated for the lamination appearance. The results are shown in Table 1.

Comparative Example 1

In the same manner as in Example 1 except for changing the encapsulant (B) on the upper protective material side from B-1 to D-1 and changing the encapsulant (D) on the back sheet side from D-1 to B-1, three solar cell modules were produced and evaluated for the lamination appearance. The results are shown in Table 1.

Comparative Example 2

In the same manner as in Example 1 except for changing the encapsulant (B) on the upper protective material side from B-1 to D-1 and changing the encapsulant (D) on the back sheet side from D-1 to B-2, three solar cell modules were produced and evaluated for the lamination appearance. The results are shown in Table 1.

Comparative Example 3

In the same manner as in Example 1 except for changing the encapsulant (B) on the upper protective material side from B-1 to D-1, three solar cell modules were produced and evaluated for the lamination appearance. The results are shown in Table 1.

Comparative Example 4

In the same manner as in Example 10 except for changing the encapsulant (B) on the upper protective material side from B-1 to D-3 and changing the encapsulant (D) on the back sheet side from D-3 to B-1, three solar cell modules were produced and evaluated for the lamination appearance. The results are shown in Table 1.

TABLE 1

| Item | | Example | | | | | | | | | | Comparative Example | | | |
|---|---|---|---|---|---|---|---|---|---|---|---|---|---|---|---|
| | | 1 | 2 | 3 | 4 | 5 | 6 | 7 | 8 | 9 | 10 | 1 | 2 | 3 | 4 |
| Encapsulant (B) on upper protective material side | | B-1 | B-1 | B-1 | B-2 | B-2 | B-2 | B-1 | B-2 | B-1 | B-1 | D-1 | D-1 | D-1 | D-3 |
| Encapsulant (D) on back sheet side | | D-1 | D-1 | D-1 | D-1 | D-1 | D-1 | D-2 | D-2 | D-3 | D-3 | B-1 | B-2 | D-1 | B-1 |
| Back Sheet (E) | | E-1 | E-2 | E-2 | E-1 | E-2 | E-2 | E-1 | E-1 | E-3 | E-3 | E-1 | E-1 | E-1 | E-3 |
| Preset Lamination Temperature (° C.) | | 125 | 125 | 135 | 125 | 125 | 135 | 125 | 125 | 135 | 145 | 125 | 125 | 125 | 145 |
| Evaluation | Flow Beginning Temperature (TB) of Encapsulant (B) (° C.) | 140 | 140 | 140 | 135 | 135 | 135 | 140 | 135 | 140 | 140 | 111 | 111 | 111 | 123 |
| | Flow Beginning Temperature (TD) of Encapsulant (D) (° C.) | 111 | 111 | 111 | 111 | 111 | 111 | 117 | 117 | 123 | 123 | 140 | 135 | 111 | 140 |
| | Flow Beginning Temperature Difference (TB − TD)(° C.) | 29 | 29 | 29 | 24 | 24 | 24 | 23 | 18 | 17 | 17 | −29 | −24 | 0 | −17 |

TABLE 1-continued

|  | Item | Example 1 | Example 2 | Example 3 | Example 4 | Example 5 | Example 6 | Example 7 | Example 8 | Example 9 | Example 10 | Comparative Example 1 | Comparative Example 2 | Comparative Example 3 | Comparative Example 4 |
|---|---|---|---|---|---|---|---|---|---|---|---|---|---|---|---|
| Lamination Appearance | Projection Phenomenon (mean value of number of projections) | A (<1) | A (0) | A (1) | B (7) | A (3) | A (4) | A (<1) | B (8) | B (8) | B (12) | C (≥16) | C (≥16) | C (≥16) | C (≥16) |
|  | Flatness | A | A | A | A | A | A | A | A | A | A | B | B | A | B |
|  | Comprehensive Evaluation | A | A | A | A | A | A | A | A | A | A | C | C | C | C |

Table 1 confirms that, when the encapsulants having the properties defined in the present invention are combined, then solar cell modules having good appearance after lamination can be obtained (Examples 1 to 10). In the case, in addition, the adhesiveness between the encapsulant and the constituent member is good. As opposed to this, it is confirmed that, when the encapsulants not satisfying the properties defined in the present invention are combined, then the evaluation of the projection appearance as the appearance evaluation after lamination is not good (Comparative Examples 1 to 4).

REFERENCE SIGNS LIST

10 Upper Protective Material (A)
12A Encapsulant (B)
12B Encapsulant (D)
14A, 14B Solar Cell Device (C)
16 Back Sheet (E)
18 Junction Box
20 Wiring

The invention claimed is:

1. A solar cell module, comprising:
an upper protective material (A);
an upper encapsulant (B);
a solar cell device (C);
a back encapsulant (D); and
a back sheet (E),
wherein the upper encapsulant (B) and the back encapsulant (D) satisfy requirement (P):
(P): a flow beginning temperature (TB) (° C.) of the upper encapsulant (B) and a flow beginning temperature (TD) (° C.) of the back encapsulant (D), as measured under a load of 1 kgf/cm$^2$, have the following relationship:

$TB-TD \geq 15$ (° C.).

2. The solar cell module according to claim 1, wherein the requirement (P) further satisfies (P-1):

$50$ (° C.)$\geq TB-TD \geq 15$ (° C.).

3. The solar cell module according to claim 1, wherein the requirement (P) further satisfies (P-2):

$40$ (° C.)$\geq TB-TD \geq 20$ (° C.).

4. The solar cell module according to claim 1, wherein the flow beginning temperature (TD) of the back encapsulant (D), as measured under a load of 1 kgf/cm$^2$, is 100° C. or higher.

5. The solar cell module according to claim 4, wherein the flow beginning temperature (TD) of the back encapsulant (D), as measured under a load of 1 kgf/cm$^2$, is 110° C. or higher.

6. The solar cell module according to claim 1, wherein the upper encapsulant (B) and the back encapsulant (D) comprise as the main component thereof an olefin-based polymer.

7. The solar cell module according to claim 1, wherein the upper encapsulant (B) and the back encapsulant (D) comprise as the main component thereof a copolymer of ethylene and an α-olefin having from 3 to 20 carbon atoms.

8. The solar cell module according to claim 7, wherein a content of a monomer unit based on the α-olefin having from 3 to 20 carbon atoms is from 2 to 40 mol % relative to the total monomer unit in the copolymer of ethylene and the α-olefin having from 3 to 20 carbon atoms.

9. The solar cell module according to claim 6, wherein the upper encapsulant (B) comprises a resin composition that comprises an olefin-based polymer having a crystal melting peak temperature of lower than 100° C. and an olefin-based polymer having a crystal melting peak temperature of 100° C. or higher.

10. The solar cell module according to claim 9, wherein the olefin-based polymer having a crystal melting peak temperature of 100° C. or higher is an ethylene-α-olefin block copolymer.

11. The solar cell module according to claim 1, wherein the upper encapsulant (B) and the back encapsulant (D) both individually comprise a xylene soluble content of 70% by mass or more, as measured according to ASTM 2765-95.

12. The solar cell module according to claim 1, wherein at least one of the upper encapsulant (B) and the back encapsulant (D) further comprises at least one additive selected from the group consisting of a silane coupling agent, an antioxidant, a UV absorbent and a weather-resistant stabilizer.

13. The solar cell module according to claim 1, wherein the upper encapsulant (B) has a laminate configuration that comprises
a soft layer of which a storage elastic modulus (E') in dynamic viscoelastometry at an oscillation frequency of 10 Hz and at a temperature of 20° C. is less than 100 MPa, and
a hard layer of which a storage elastic modulus (E) in dynamic viscoelastometry at an oscillation frequency of 10 Hz and at a temperature of 20° C. is 100 MPa or more.

14. The solar cell module according to claim 1, wherein the back encapsulant (D) further comprises a white pigment.

15. The solar cell module according to claim 1, wherein the upper protective material (A) is a glass plate and the solar cell device (C) is at least one selected from a monocrystalline silicon form and a polycrystalline silicone form.

16. A method for producing the solar cell module according to claim 1, the method comprising:
   laminating a solar cell module that comprises:
   an upper protective material (A);
   an upper encapsulant (B);
   a solar cell device (C);
   a back encapsulant (D); and
   a back sheet (E),
   wherein a flow beginning temperature (TB) (° C.) of the upper encapsulant (B) and a flow beginning temperature (TD) (° C.) of the back encapsulant (D), as measured under a load of 1 kgf/cm², have the following relationship:

$TB-TD \geq 15$ (° C.), and wherein the encapsulant having a higher flow beginning temperature is arranged on a side of a heat source in lamination.

17. The method according to claim 16, wherein the lamination temperature in lamination is from 100 to 135° C.

\* \* \* \* \*